United States Patent
Shin et al.

(10) Patent No.: US 10,283,207 B2
(45) Date of Patent: May 7, 2019

(54) NON-VOLATILE MEMORY DEVICES COMPRISING HIGH VOLTAGE GENERATION CIRCUITS AND OPERATING METHODS THEREOF

(71) Applicant: Samsung Electronics Co., Ltd., Suwon-si, Gyeonggi-do (KR)

(72) Inventors: Ho-young Shin, Gunpo-si (KR); Myeong-hee Oh, Seongnam-si (KR); Ji-sung Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/611,171

(22) Filed: Jun. 1, 2017

(65) Prior Publication Data

US 2017/0352428 A1   Dec. 7, 2017

(30) Foreign Application Priority Data

Jun. 3, 2016 (KR) .................. 10-2016-0069390
Oct. 12, 2016 (KR) .................. 10-2016-0132143

(51) Int. Cl.
| | |
|---|---|
| *G11C 16/30* | (2006.01) |
| *G11C 16/04* | (2006.01) |
| *G11C 16/32* | (2006.01) |
| *G11C 16/12* | (2006.01) |
| *G06F 12/02* | (2006.01) |
| *G11C 16/08* | (2006.01) |
| *G11C 16/10* | (2006.01) |

(52) U.S. Cl.
CPC .......... *G11C 16/30* (2013.01); *G06F 12/0246* (2013.01); *G11C 16/0425* (2013.01); *G11C 16/0483* (2013.01); *G11C 16/08* (2013.01); *G11C 16/10* (2013.01); *G11C 16/12* (2013.01); *G11C 16/32* (2013.01); *G06F 2212/7201* (2013.01)

(58) Field of Classification Search
CPC ......... G11C 16/30; G11C 16/12; G11C 16/32; G11C 16/0483; G11C 16/0425; G06F 12/0246; G06F 2212/7201; H01L 27/11521; H01L 29/42328; H01L 29/7884
See application file for complete search history.

(56) References Cited

U.S. PATENT DOCUMENTS

| | | |
|---|---|---|
| 5,740,109 A | 4/1998 | Morton et al. |
| 6,487,116 B2 | 11/2002 | Khan et al. |
| 7,221,610 B2 | 5/2007 | Yamazoe et al. |
| 7,251,162 B2 | 7/2007 | Kawajiri et al. |
| 7,349,255 B2 | 3/2008 | Wong |

(Continued)

*Primary Examiner* — Jerome Leboeuf
(74) *Attorney, Agent, or Firm* — Myers Bigel, P.A.

(57) ABSTRACT

A non-volatile memory device includes a memory cell array including a plurality of memory cells, wherein at least one selected memory cell that is selected from among the plurality of memory cells is programmed based on a high voltage, a high voltage generator configured to generate the high voltage by boosting an input voltage based on a pumping clock, a pumping clock generator configured to generate the pumping clock, a program current controller configured to adjust a program current flowing in the at least one selected memory cells, and a control logic configured to control a frequency of the pumping clock and an amount of the program current based on a time in a program section in which the at least one selected memory cell is programmed.

20 Claims, 22 Drawing Sheets

(56) References Cited

U.S. PATENT DOCUMENTS

| | | |
|---|---|---|
| 7,428,172 B2 | 9/2008 | Choy et al. |
| 8,098,528 B2 | 1/2012 | Ryu |
| 8,699,247 B2 | 4/2014 | Nguyen et al. |
| 8,755,242 B2 | 6/2014 | Lee et al. |
| 8,817,553 B2 * | 8/2014 | Yu .......................... G11C 5/145 365/189.07 |
| 9,553,506 B1 * | 1/2017 | Huynh .................... H02M 3/07 |
| 2008/0031078 A1 * | 2/2008 | Kang ..................... G11C 5/145 365/233.1 |
| 2015/0003166 A1 * | 1/2015 | Tran ....................... G11C 16/26 365/185.18 |
| 2016/0203845 A1 * | 7/2016 | Peng ..................... G11C 5/145 365/226 |

* cited by examiner

NON-VOLATILE MEMORY DEVICES COMPRISING HIGH VOLTAGE GENERATION CIRCUITS AND OPERATING METHODS THEREOF

CROSS-REFERENCE TO RELATED APPLICATIONS

This U.S. non-provisional patent application claims the benefit of priority under 35 U.S.C. § 119 to Korean Patent Application No. 10-2016-0069390, filed on Jun. 3, 2016, and Korean Patent Application No. 10-2016-0132143, filed on Oct. 12, 2016, in the Korean Intellectual Property Office, the entire contents of which are incorporated herein by reference.

BACKGROUND

The inventive concepts relate to semiconductor devices, and more particularly, to non-volatile semiconductor memory devices including a high voltage generation circuits for generating a high voltage by boosting an input voltage, and methods of operating the non-volatile memory devices.

Recently, the demand for non-volatile semiconductor memory devices that are highly integrated and have large capacity has increased. A representative non-volatile memory device may be flash memory that is used in portable electronic devices. In addition, research into non-volatile memory devices that are randomly accessed and have improved performance has been conducted. For example, non-volatile memory devices may be ferroelectric random access memory (FRAM), magnetic RAM (MRAM), phase change RAM (PRAM), resistive RAM (RRAM), or the like. When a relatively high voltage has to be used during a write operation of a non-volatile memory device, the non-volatile memory device may include a high voltage generation circuit for generating the high voltage by boosting an input voltage.

SUMMARY

The inventive concepts provide non-volatile memory devices that stably perform a write operation in a low-current mode in which an input current is low, and methods of operating the non-volatile memory devices.

According to an aspect of the inventive concepts, there is provided a non-volatile memory device including: a memory cell array including a plurality of memory cells, where at least one selected memory cell that is selected from among the plurality of memory cells is programmed based on a high voltage, a high voltage generator configured to generate the high voltage by boosting an input voltage based on a pumping clock, a pumping clock generator configured to generate the pumping clock, a program current controller configured to adjust a program current flowing in the at least one selected memory cell, and a control logic configured to control a frequency of the pumping clock and an amount of the program current based on a time in a program section in which the at least one selected memory cell is programmed.

According to another aspect of the inventive concepts, there is provided a non-volatile memory device including a memory cell array including memory cells that are programmed based on a high voltage and a program current, a high voltage generator configured to generate the high voltage by boosting an input voltage based on a pumping clock, and a control logic configured to control a frequency of the pumping clock and an amount of a program current of the high voltage generator to change stepwise during the generation of the high voltage.

According to another aspect of the inventive concepts, there is provided a non-volatile memory device including a high voltage generation circuit configured to generate a high voltage from an input voltage based on a pumping clock signal, a program current controller configured to control a program current, a memory cell array including at least one memory cell that is configured to be programmed responsive to the high voltage and the program current, and a control logic configured to control a frequency of the pumping clock signal and an amount of the program current based on a time period within a program operation during which the high voltage is generated.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
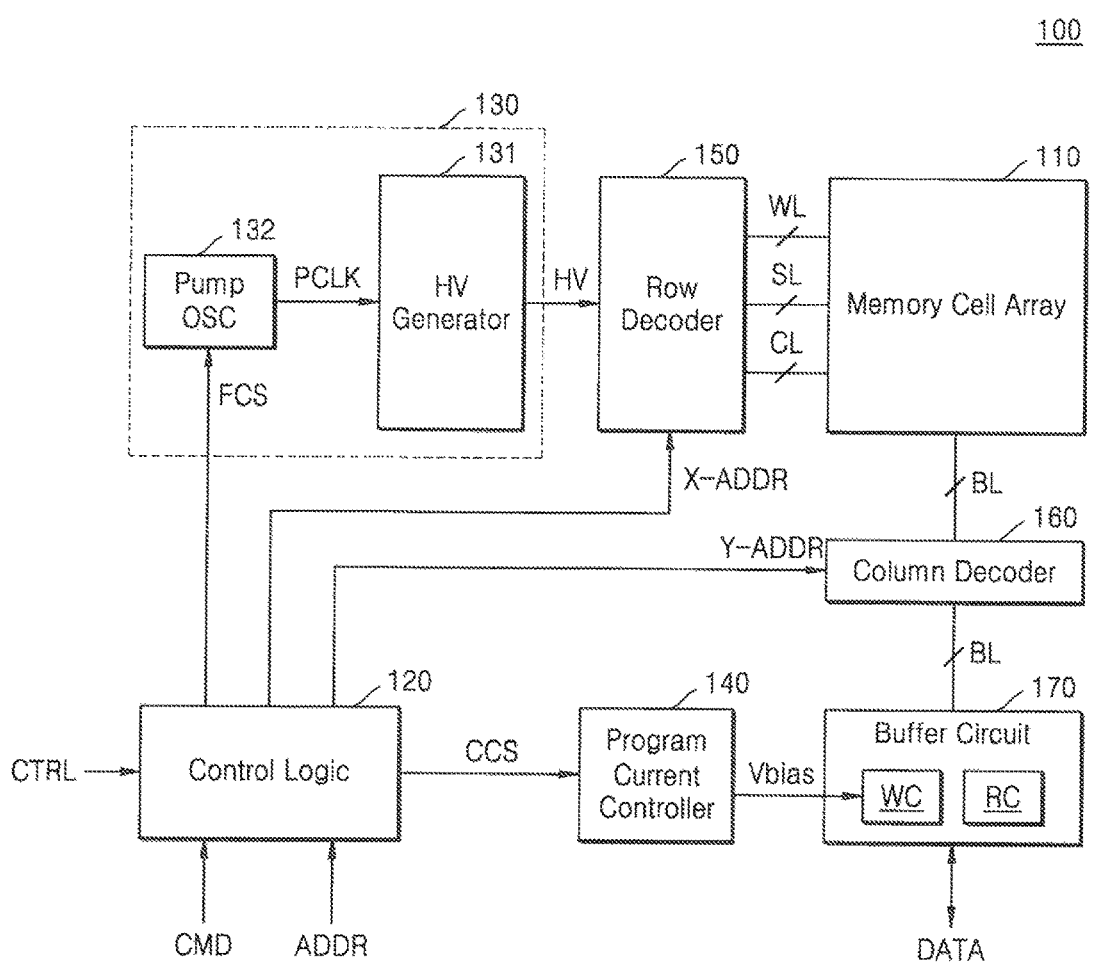
FIG. 1 is a block diagram of a memory device according to an embodiment of the inventive concepts.

FIG. 1 is a block diagram of a memory device 100 according to an embodiment of the inventive concepts.

Referring to FIG. 1, the memory device 100 may include a memory cell array 110, a control logic 120, a voltage generation circuit 130, a program current controller 140, a row decoder 150, a column decoder 160, and a buffer circuit 170. The memory device 100 may further include a data input/output (I/O) circuit and/or an I/O interface.

The memory cell array 110 may include memory cells. The memory cells may be programmed in a hot carrier injection (HCI) manner. For example, the memory cells may be flash memory cells. For example, in an embodiment, the memory cells may be NOR flash memory cells. However, the inventive concepts are not limited thereto. The memory cells may be non-volatile memory cells of various types. In an embodiment, the memory cells may be NAND flash memory cells. Also, the memory cells may be resistive memory cells such as resistive random access memory (RRAM), phase change RAM (PRAM), and/or magnetic RAM (MRAM).

The memory cell array 110 may be connected to word lines WL, source lines SL, control lines CL, and bit lines BL. For example, the memory cell array 110 may be connected to the row decoder 150 through the word lines WL, the source lines SL, and/or the control lines CL and to the column decoder 160 through the bit lines BL. In an embodiment, the memory cell array 110 may be connected to erase lines, and the control lines CL may not be formed. However, the inventive concepts are not limited thereto. The types of lines connected to the memory cell array 110 may differ according to its structure.

The voltage generation circuit 130 may generate various types of voltages for performing a program operation, a read operation, and/or an erase operation on the memory cell array 110 according to control of the control logic 120. The voltage generation circuit 130 may boost an input voltage to generate a high voltage HV used to perform a program operation. To this end, the voltage generation circuit 130 may include an HV generator 131 and a pumping clock generator 132.

The HV generator 131 may generate a high voltage HV by boosting an input voltage, for example, a power voltage, during the program operation. The HV generator 131 may be embodied as a charge pump circuit and may boost an input voltage based on a pumping clock PCLK. In an embodiment, the HV generator 131 may apply the HV to the source lines SL and/or the control lines CL through the row decoder 150. During the program operation, a program current (Ip of FIG. 4) for HCI may be applied by the HV generator 131 to selected ones of the memory cells of the memory cell array 110. In some embodiments, a pumping clock PCLK may be a pumping clock signal with a given frequency.

The pumping clock generator 132 may generate pumping clocks PCLK and may provide the generated pumping clocks PCLK to the HV generator 131. The pumping clock generator 132 may be an oscillator. The pumping clock generator 132 may receive a frequency control signal FCS from the control logic 120 and may adjust a frequency of the pumping clock PCLK according to the frequency control signal FCS. For example, according to the frequency control signal FCS, the pumping clock generator 132 may generate a pumping clock PCLK having a frequency that increases or decreases by integer multiples of a fundamental frequency.

As a frequency of the pumping clock PCLK increases, the current driving capability of the HV generator 131 may increase. In other words, when the frequency of the pumping clock PCLK is high, the HV generator 131 may output a large amount of the driving currents (or load currents) and may generate a high voltage HV having a target level.

However, as the frequency of the pumping clock PCLK increases, a consumed current of the voltage generation circuit 130 may increase. As the frequency of the pumping clock PCLK decreases, the consumed current of the voltage generation circuit 130 and the current driving capability of the HV generator 131 may decrease. When the HV generator 131 outputs a greater amount of the driving currents than a driving capacity of the HV generator 131, the HV generator 131 may not be able to generate the high voltage HV at the target level.

The row decoder 150 may select some word lines WL, some source lines SL and/or some control lines CL from among the word lines WL, the source lines SL and the control lines CL, in response to a row address X-ADDR received from the control logic 120.

The row decoder 150 may apply a high voltage HV to the selected word lines WL, the selected source lines SL, and/or the selected control lines CL during the program operation and may apply an inhibit voltage to non-selected word lines WL, non-selected source lines SL, and/or non-selected control lines CL.

The column decoder 160 may select some of the bit lines BL in response to a column address Y-ADDR received from the control logic 120. The selected bit lines BL may be connected to the buffer circuit 170.

The buffer circuit 170 may be connected to the selected bit lines BL, may write received data DATA to the memory cell array 110, and may read data DATA stored in the memory cell array 110. The buffer circuit 170 may include a write circuit WC and a read circuit RC.

The read circuit RC may read the data DATA from selected memory cells. The read circuit RC may include a sense amplifier.

The write circuit WC may write the data DATA to the selected memory cells. The write circuit WC may provide the program current Ip to each of the selected memory cells through the selected bit lines BL. For example, the write circuit WC may generate the program current Ip and may write the data DATA to the selected memory cells by controlling the program current Ip to flow in each of the selected memory cells. The write circuit WC may adjust the amount of the program current Ip based on a bias signal, for example, a bias voltage Vbias, which is received from the program current controller 140. As described above, the program current Ip may be output from the HV generator 131 providing the high voltage HV to the selected memory cells.

The program current controller 140 may receive a current control signal CCS from the control logic 120 and may adjust the amount of the program current Ip based on the current control signal CCS. For example, the program current controller 140 may generate a bias signal, for example, the bias voltage Vbias, for controlling the program current Ip and provide the generated bias voltage Vbias to the write circuit WC. The program current controller 140 may adjust a level of the bias voltage Vbias according to the current control signal CCS.

The control logic 120 may output various control signals for writing data to the memory cell array 110 and/or reading data from the memory cell array 110 based on a command CMD, an address ADDR, and/or a control signal CTRL received from an external device, for example, an external processor or an external controller. Thus, the control logic 120 may control all operations of the memory device 100.

The control signals output from the control logic 120 may be provided to the voltage generation circuit 130, the program current controller 140, the row decoder 150, and/or the column decoder 160. In particular, the control logic 120 may provide the frequency control signal FCS to the pumping clock generator 132 and the current control signal CCS to the program current controller 140. Also, the control logic 120 may provide the row address X-ADDR to the row decoder 150 and the column address Y-ADDR to the column decoder 160. However, the inventive concepts are not limited thereto. The control logic 120 may further provide control signals such as write enable signals to the voltage generation circuit 130, the program current controller 140, the row decoder 150, the column decoder 160, and/or the buffer circuit 170.

The control logic 120 may control the amount of the program current Ip as well as the frequency of the pumping clock PCLK used to generate the high voltage HV. As described above, the high voltage HV may be generated during the program operation. The control logic 120 may control the frequency of the pumping clock PCLK and the amount of the program current Ip to change according to time in a program section. In other words, the control logic 120 may control the frequency of the pumping clock PCLK and the amount of the program current Ip based on a particular time period of the program operation during which the high voltage HV is generated. As the amount of the program current Ip changes, the amount of a driving current output from the HV generator 131 may change. In some embodiments, the program section may be a program cycle of the memory cell.

The control logic 120 may set the frequency of the pumping clock PCLK to be low at an initial voltage boosting stage, in other words, an initial program section, so as to reduce a peak current of the memory device 100. In this case, since the current driving capability of the HV generator 131 is low, the amount of the program current Ip may be reduced to reduce the amount of the driving current output from the HV generator 131.

Then, when the high voltage HV is at a target level, the control logic 120 may increase the frequency of the pumping clock PCLK as well as the amount of the program current Ip. For example, the control logic 120 may control the frequency of the pumping clock PCLK and the amount of the program current Ip as a target frequency and a target current amount, respectively. In an embodiment, the target current amount may indicate the amount of the program current Ip that is set to normally program a memory cell, and the target frequency may indicate the frequency of the pumping clock PCLK that is set to allow the HV generator 131 to stably generate a high voltage HV at a target level when a driving current according to the target current amount is output from the HV generator 131. The target frequency and the target current amount may be set in advance by taking into account a memory cell and a circuit characteristic of the HV generator 131. The target frequency and the target current amount may vary according to control of a user of the memory device 100 or may be programmable according to an operation environment. For example, the control logic 120 may change the target level and the target frequency in response to a received command CMD. In an embodiment, the control logic 120 may change the target level and the target frequency according to various preset conditions regarding the operation environment.

The control logic 120 may control the frequency of the pumping clock PCLK and the amount of the program current Ip by changing values (or levels) of the frequency control signal FCS and the current control signal CCS.

In an embodiment, the control logic 120 may control the amount of the program current Ip based on the changing frequency of the pumping clock PCLK.

In an embodiment, the control logic 120 may control the frequency of the pumping clock PCLK and the amount of the program current Ip to increase stepwise during the program operation.

In an embodiment, the control logic 120 may generate state signals based on a preset logic time and may change the values of the frequency control signal FCS and the current control signal CCS, depending on states indicated by the state signals.

In an embodiment, the control logic 120 may control the frequency of the pumping clock PCLK and the amount of the program current Ip based on a level of the high voltage HV during a boosting process.

When the frequency of the pumping clock PCLK decreases at the initial voltage boosting stage while the high voltage HV is generated, the peak current of the memory device 100 may decrease. However, as the current driving capability of the HV generator 131 degrades, a time which is taken by the HV generator 131 to generate the high voltage HV having a desired level may increase, and when the driving current of the HV generator 131 is greater than the driving capacity thereof, the high voltage HV may not be boosted to the target level.

However, the memory device 100 may simultaneously decrease the frequency of the pumping clock PCLK and the amount of the program current Ip at the initial voltage boosting stage, and thus, the high voltage HV may be rapidly boosted to the target level. The memory device 100 may increase the frequency of the pumping clock PCLK to a target frequency and the amount of the program current Ip to the target current amount after the high voltage HV is boosted to the target level. The memory device 100 may reduce the peak current of the memory device 100 and may normally perform the program operation by simultaneously controlling the frequency of the pumping clock PCLK and the amount of the program current Ip during the program operation.

Figure 2A:
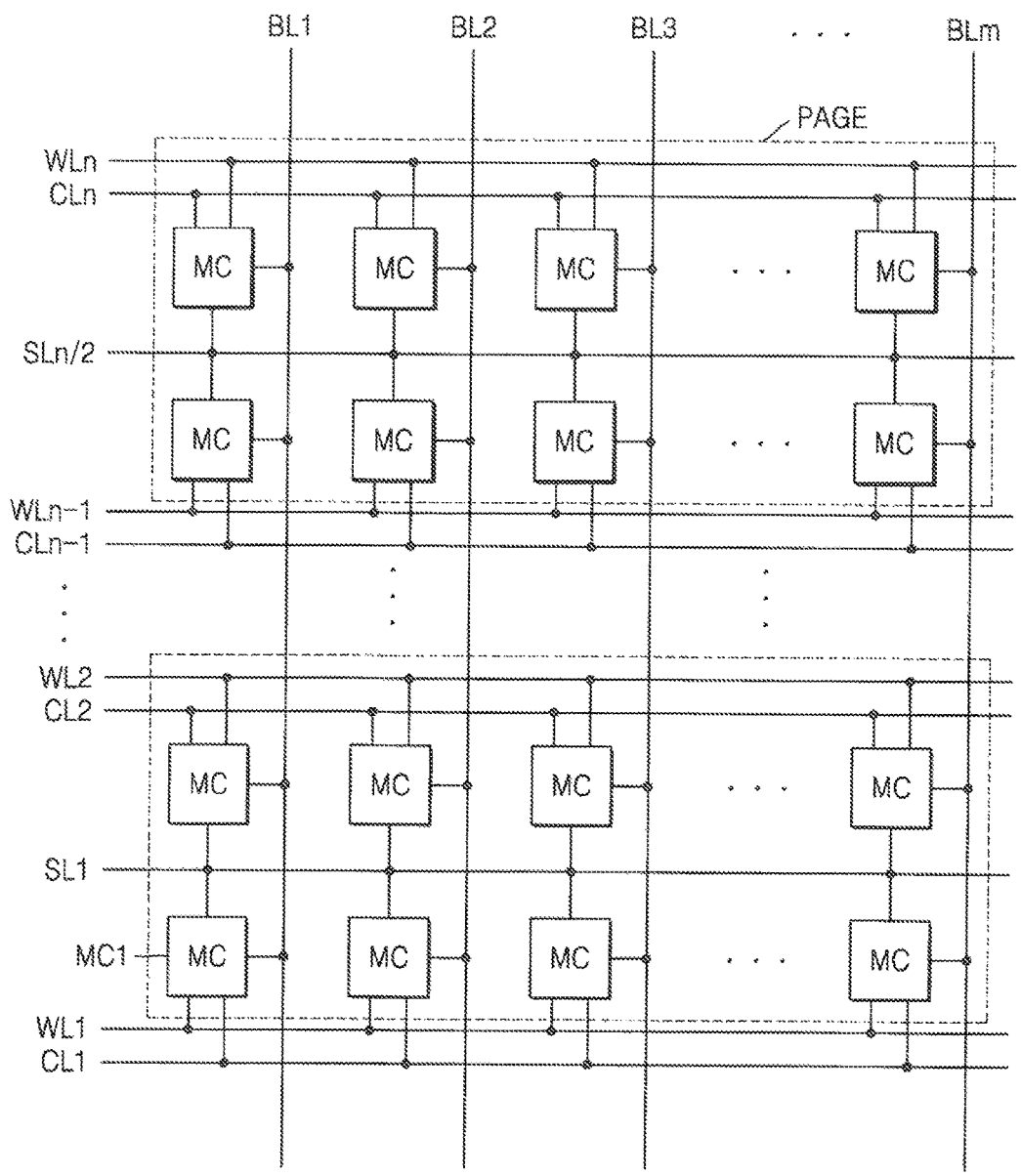
FIG. 2A is a circuit diagram schematically showing a memory cell array of FIG. 1.
Figure 2B:
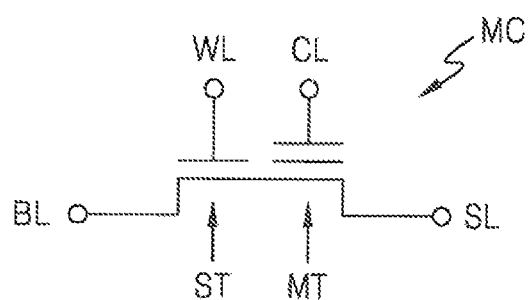
FIG. 2B is a circuit diagram of an example of a memory cell.

FIG. 2A is a circuit diagram schematically showing a memory cell array 110 of FIG. 1. FIG. 2B is a circuit diagram of an example of a memory cell MC.

Referring to FIG. 2A, the memory cell array 110 may include memory cells MC arranged in a matrix. The memory cells MC may be connected to word lines WL1 to WLn, control lines CL1 to CLn, source lines SL1 to SLn, and bit lines BL1 to BLn. For example, a first memory cell MC1 may be connected to a first word line WL1, a first source line SL1, a first control line CL1, and/or a first bit line BL1. In this case, the terms such as "first" and "second" are used to distinguish one component from another component, but do not limit an order of the components. For example, a first component may be termed a second component, and similarly, a second component may be termed a first component.

FIG. 2A shows that memory cells in two rows are connected to one source line. However, the inventive concepts are not limited thereto. Memory cells in one row may be connected to one source line. Also, the memory cell array 110 may further include erase lines, and the memory cells MC may be connected to the erase lines.

Referring to FIG. 2B, the memory cell MC may include a memory transistor MT and a selection transistor ST that are connected in series between the source line SL and the bit line BL. A gate of the memory transistor MT may be connected to the control line CL, and a gate of the selection transistor ST may be connected to the word line WL.

However, a structure and a connection relationship of the memory cells MC are not limited thereto and may vary. For example, the memory cell MC may further include an erase gate, and the erase gate may be connected to an erase line.

Referring to FIG. 2A, the memory cells MC may be connected in parallel. Accordingly, the memory cells MC may be randomly accessed, and data may be written to the memory cell array 110 and/or may be read therefrom in a byte unit and/or a word unit. The memory cells MC connected to a source line (e.g., the source line SL1 or a source line SLn/2) may be a page unit, and an erase operation may be performed by page units.

Figure 3A:
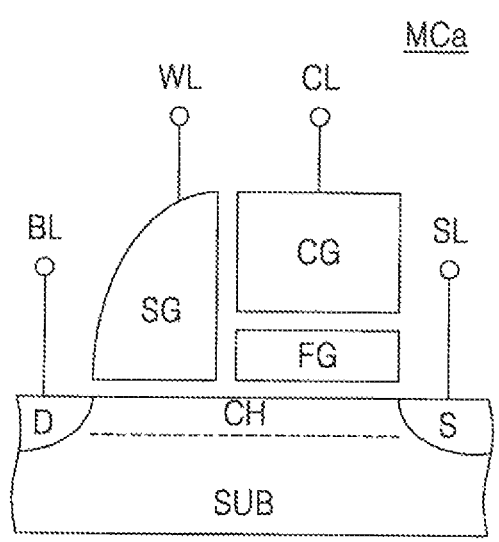
FIGS. 3A to 3C are diagrams of examples of cross-sections of structures of memory cells.
Figure 3B:
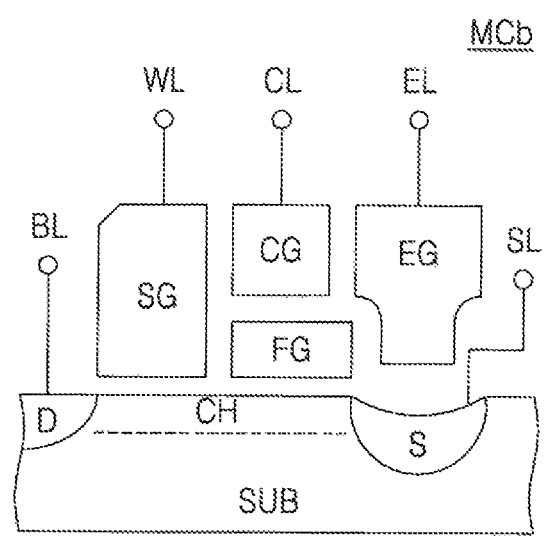
Figure 3C:
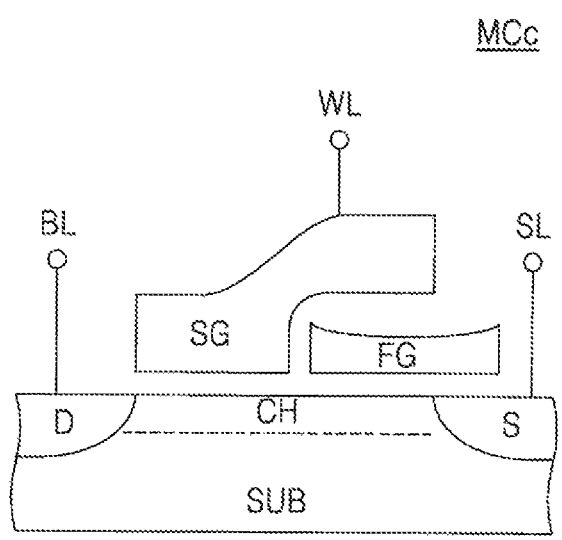

FIGS. 3A to 3C are diagrams of examples of cross-sections of structures of memory cells MCa to MCc.

Referring to FIG. 3A, a source S and a drain D are separated from each other in a semiconductor substrate SUB, and a channel CH may be between the source S and the drain D. A floating gate FG may be above a first portion of the channel CH, and a control gate CG may be above the floating gate FG. A selection gate SG may be next to side surfaces of the floating gate FG and a second portion of the channel CH.

A structure of the memory cell MCb shown in FIG. 3B is similar to a structure of the memory cell MCa shown in FIG. 3A. However, an erase gate EG may be above the source S and next to a side surface of the floating gate FG in the memory cell MCb.

Referring to FIG. 3C, in a memory cell MCc, the floating gate FG may be above a portion of the source S and a first portion of the channel CH. The selection gate SG (or a control gate) may be above a portion of the floating gate FG and a second portion of the channel CH, which is close to a side surface of the floating gate FG.

The structures of the memory cells MCa to MCc have been described with reference to FIGS. 3A to 3C. However, the inventive concepts are not limited thereto. The structures may vary.

Figure 4:
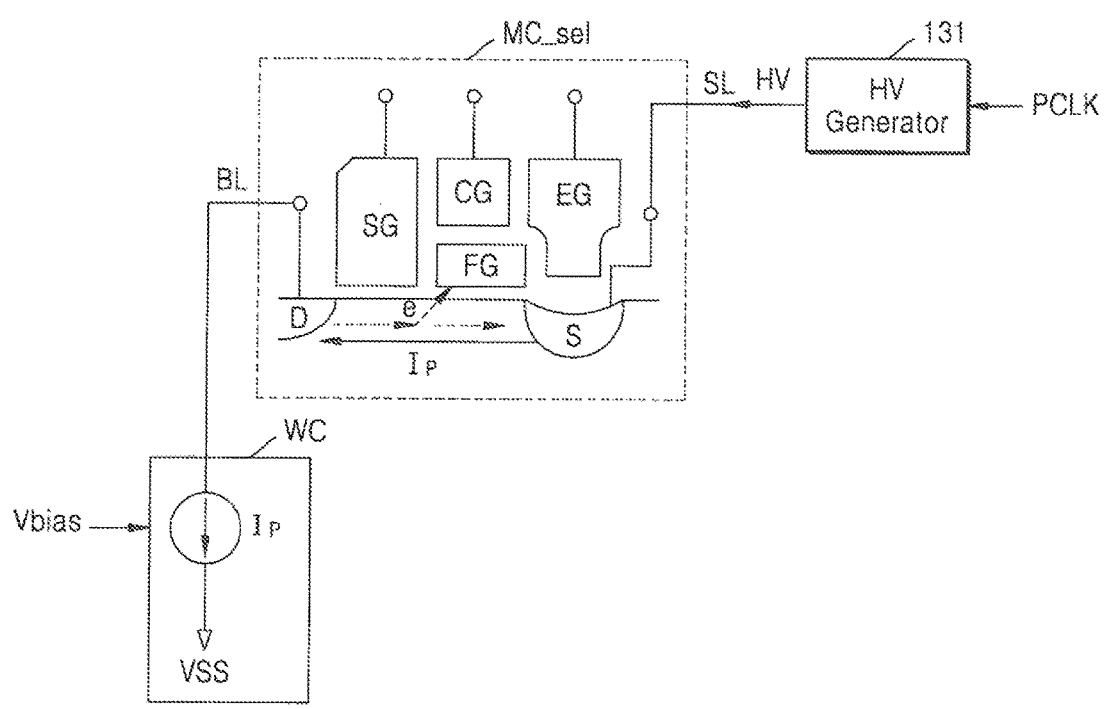
FIG. 4 shows a program operation of a memory cell according to an embodiment of the inventive concepts.

FIG. 4 is a diagram showing a program operation of a memory cell MC_sel according to an embodiment of the inventive concepts.

Referring to FIG. 4, a high voltage HV output from the HV generator 131 may be applied to a source S of the memory cell MC_sel selected for the program operation, and a drain D may be connected to the write circuit WC via a bit line BL. The write circuit WC may generate a program current Ip based on a bias voltage Vbias and may allow the program current Ip to sink from the selected memory cell MC_sel. Accordingly, as the program current Ip flows from the source S to the drain D of the selected memory cell MC_sel, negative charges e (or hot carriers) are injected into the floating gate FG, and thus the selected memory cell MC_sel may be programmed. As shown in FIG. 4, the program current Ip may be output from the HV generator 131. In an embodiment, the high voltage output from the HV generator 131 may be provided through the row decoder 150 (see FIG. 1), such as via source line SL. Although FIG. 4 shows one selected memory cell MC_sel, multiple selected memory cells MC_sel may be simultaneously programmed during the program operation. Though the memory cell MC_sel shares a cross-section similar to that of the memory cell MCa of FIG. 3A, it will be understood that other memory cell configurations may be possible within the present inventive concepts, including the memory cells MCb and MCc of FIGS. 3B and 3C, respectively, as well as other memory cell configurations.

As described above with reference to FIG. 1, the memory device 100 may control the frequency of the pumping clock PCLK and the amount of the program current Ip in such a manner that a driving current of the HV generator 131, that is, a sum of the amount of the program current Ip flowing in each of the selected memory cells MC_sel, does not exceed driving capacity of the HV generator 131 according to the frequency of the pumping clock PCLK, during the program operation.

Figure 5:
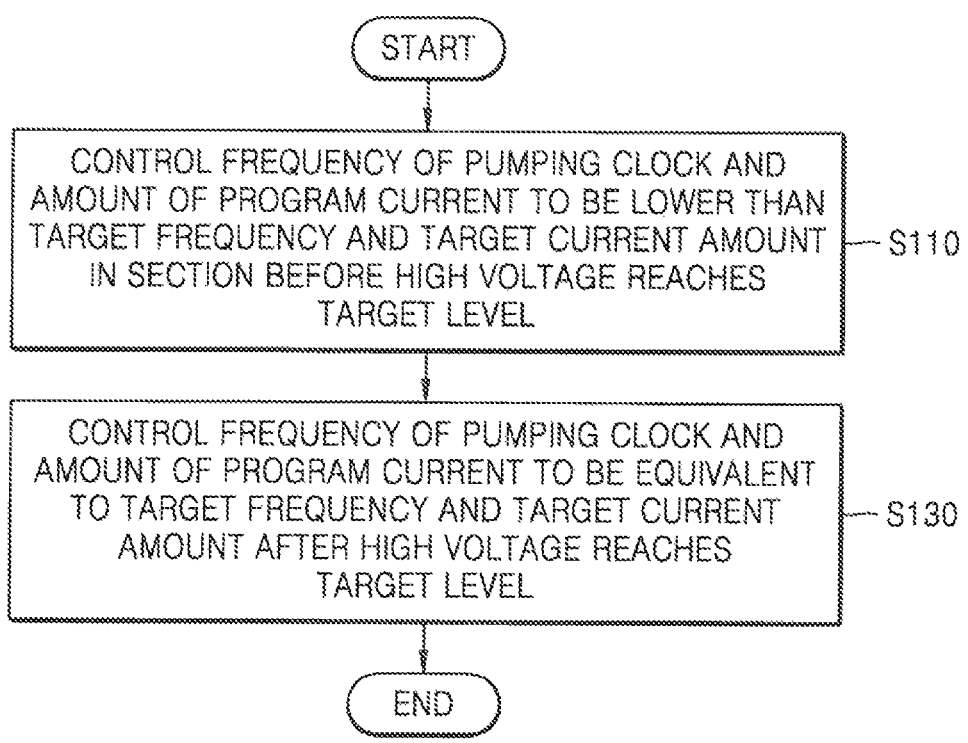
FIG. 5 is a flowchart of a method of operating a memory device, according to an embodiment of the inventive concepts.

FIG. 5 is a flowchart of a method of operating a memory device, according to an embodiment of the inventive concepts. The method of FIG. 5 may be performed by the memory device 100 of FIG. 1, and thus the method of operating and programming the memory device 100, which has been described with reference to FIGS. 1 and 4, may be applied to the present embodiment. In particular, FIG. 5 shows that the pumping clock PCLK (of FIG. 1) and the amount of the program current Ip (of FIG. 4) are controlled stepwise during the program operation.

Referring to FIG. 5, in operation S110, the memory device 100 may control the frequency of the pumping clock PCLK to be lower than a target frequency and the amount of the program current Ip to be less than a target current amount before a high voltage HV reaches a target level. For example, the control logic 120 may provide the pumping clock generator 132 with the frequency control signal FCS, which is used to set a frequency lower than the target frequency, and may provide the program current controller 140 with the current control signal CCS used to set a current amount of the program current Ip that is less than the target current amount. In an embodiment, the memory device 100 may control the frequency of the pumping clock PCLK to be 1/N times (where, N is an integer greater than 1) as high as the target frequency and may control the amount of the program current Ip to be 1/M times (where, M is an integer greater than 1) as great as the target current amount. Accordingly, the HV generator 131 may stably generate the high voltage HV having a target level.

In operation S130, the memory device 100 may control the frequency of the pumping clock PCLK and the amount of the program current Ip to be equivalent to the target frequency and the target current amount after the HV reaches the target level. In an embodiment, the memory device 100 may control the frequency of the pumping clock PCLK and the amount of the program current Ip to reach the target frequency and the target current amount, respectively, after the HV reaches the target level.

Figure 6A:
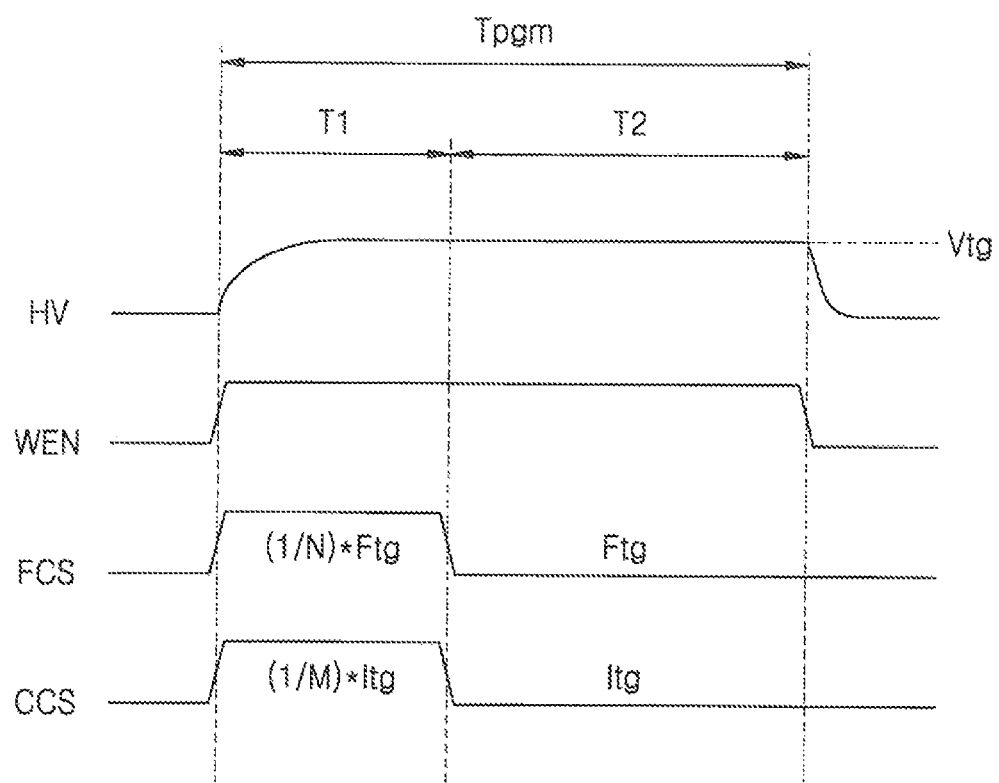
FIGS. 6A to 6C show examples of control signals and waveforms of high voltages of a memory device according to an embodiment of the inventive concepts.
Figure 6B:
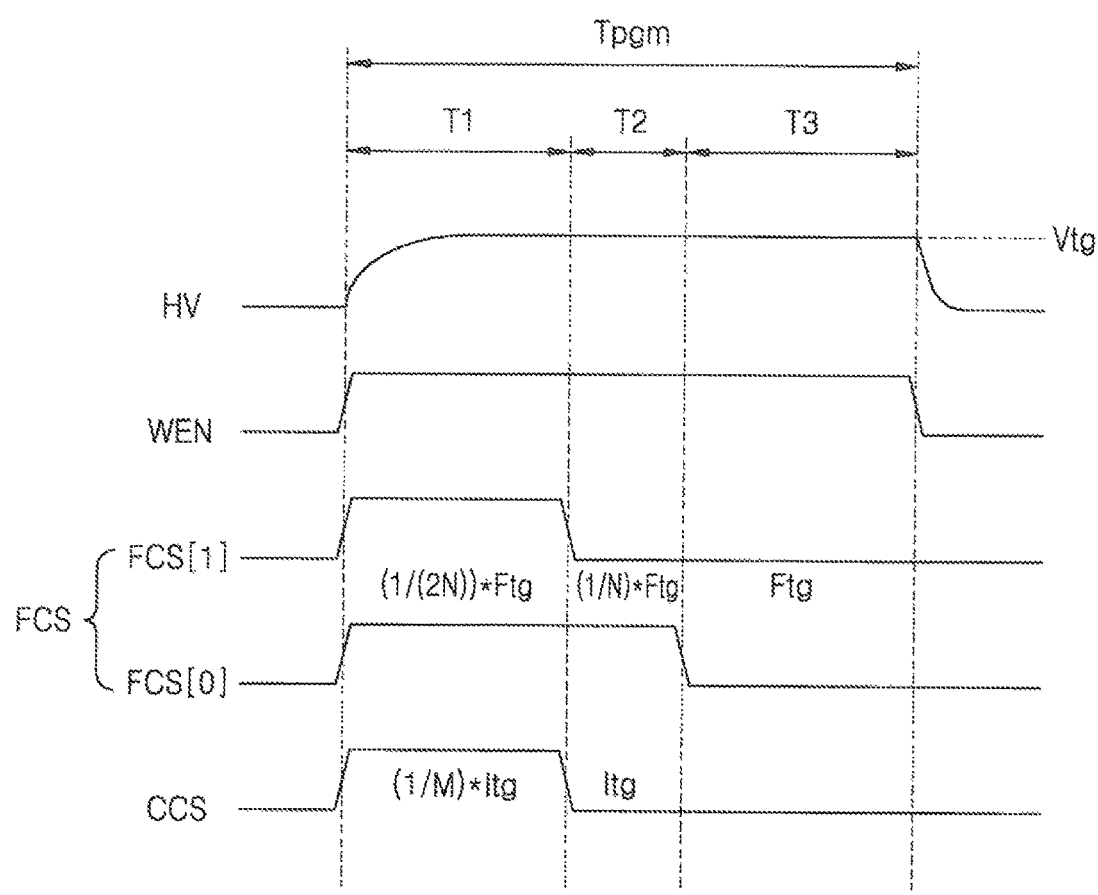
Figure 6C:
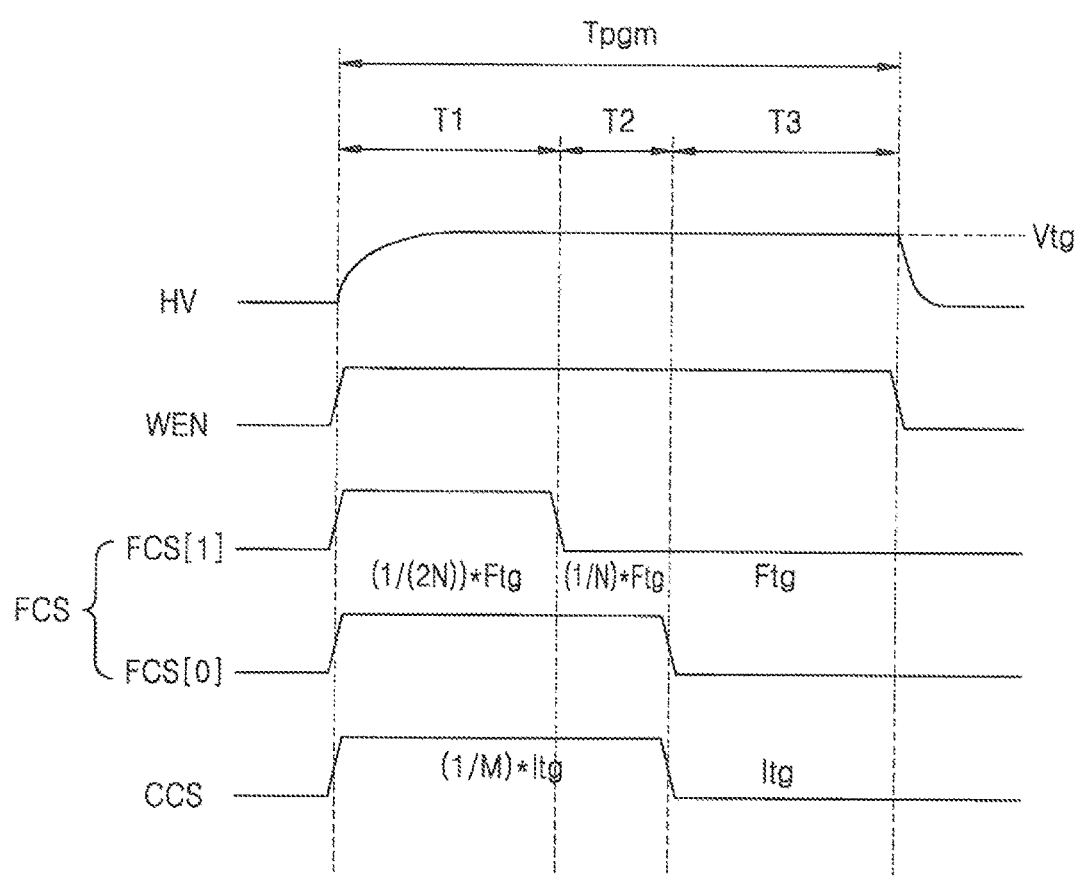

FIGS. 6A to 6C show examples of control signals and high-voltage waveforms of a memory device according to an embodiment of the inventive concepts. FIGS. 6A to 6C show control signals of the memory device 100 of FIG. 1 and waveforms of the high voltages HV.

Referring to FIGS. 6A to 6C, a write enable signal WEN may be activated in a program section Tpgm whereby a program operation is performed on selected memory cells. The control logic 120 (of FIG. 1) may output the write enable signal WEN that is activated in response to a command CMD commanding a write operation. The voltage generation circuit 130 and the write circuit WC may operate in response to the activated write enable signal WEN.

Referring to FIG. 6A, the program section Tpgm may include at least two sections, for example, a first section T1 and a second section T2. In an embodiment, the first section T1 and the second section T2 may be different time periods within the program section and/or operation Tpgm. In an embodiment, the first section T1 and the second section T2 may be distinguishable according to the frequency of the pumping clock PCLK. In another embodiment, the first section T1 and the second section T2 may be distinguishable according to a state signal indicating a program state of the memory device 100.

The first section T1 may be an initial part of the program section Tpgm, and in some embodiments may be an HV set-up section. The control logic 120 may output the frequency control signal FCS, which sets the frequency of the pumping clock PCLK to be lower than a target frequency Ftg, and the current control signal CCS, which sets the amount of the program current Ip to be less than a target current amount Itg, in the first section T1. For example, in the first section T1, the frequency of the pumping clock PCLK may be 1/N times as high as the target frequency Ftg using the frequency control signal FCS, and the amount of the program current Ip may be 1/M times as great as the target current amount Itg using the current control signal CCS. Accordingly, the high voltage HV may stably reach the target level Vtg in the first section T1.

The second section T2 may be a section after the high voltage HV reaches the target level Vtg. The control logic 120 may output the frequency control signal FCS, which sets the frequency of the pumping clock PCLK as the target frequency Ftg, and the current control signal CCS, which sets the amount of the program current Ip as the target current amount Itg, in the second section T2.

In some embodiments, the frequency control signal FCS and the current control signal CCS may be logic signals that control the frequency of the pumping clock PCLK and/or the amount of the program current Ip. For example, as illustrated in FIG. 6A, when the current control signal CCS rises (e.g. a logical "high"), the amount of the program current Ip may be set to 1/M times as high as the target current amount Itg. When the current control signal CCS falls (e.g. a logical "low"), the amount of the program current Ip may be set to the target current amount Itg. Similarly, when the frequency control signal FCS rises (e.g. a logical "high"), the frequency of the pumping clock PCLK may be set to 1/N times as high as the target frequency Ftg. When the frequency control signal FCS falls (e.g. a logical "low"), the frequency of the pumping clock PCLK may be set to the target frequency Ftg. It will be understood that other logic implementations are possible, such as reversing the operations for the logical high/low states, without deviating from the present inventive concepts. Similarly, though illustrated as logical signals in FIG. 6A, it will be understood that other signaling implementations are possible to control the frequency of the pumping clock PCLK and/or the amount of program current Ip without deviating from the present inventive concepts.

As described above, the memory device 100 according to an embodiment may reduce the peak current and stably generate the high voltage HV by setting the frequency of the pumping clock PCLK as a low frequency in an initial part of the program section Tpgm using the frequency control signal FCS, for example, the HV set-up section, and by decreasing the amount of the program current Ip using the current control signal CCS. In addition, the memory device 100 according to an embodiment may increase the frequency of the pumping clock PCLK using the frequency control signal FCS and the amount of the program current Ip using the current control signal CCS after the high voltage HV reaches the target level Vtg.

Referring to FIGS. 6B and 6C, the program section Tpgm may include first to third sections T1 to T3. The frequency control signal FCS may include bits FCS[0] and FCS[1] and may have at least three values. The control logic 120 may output the frequency control signal FCS that increases the frequency of the pumping clock PCLK stepwise in the first to third sections T1 to T3. Accordingly, the frequency of the pumping clock PCLK may increase stepwise in the first to third sections T1 to T3. For example, the frequency of the pumping clock PCLK may be controlled to be 1/(2N) times of the target frequency Ftg in the first section T1, to be 1/N times of the target frequency Tfg in the second section T2, and controlled to be equivalent to the target frequency Ftg in the third section T3. The control logic 120 may output the current control signal CCS that increases the amount of the program current Ip stepwise in the first to third sections T1 to T3 to the program current controller 140. Referring to FIG. 6B, for example, the amount of the program current Ip may be controlled to be 1/M of the target current amount Itg in the first section T1 and controlled to be equivalent to the target current amount Itg in the second section T2 and the third section T3. Referring to FIG. 6C, the amount of the program current Ip may be controlled to be 1/M of the target current amount Itg in the first section T1 and the second section T2 and controlled to be equivalent to the target current amount Itg in the third section T3.

FIGS. 6B and 6C show that the current control signal CCS is a single-bit signal. However, the inventive concepts are not limited thereto. The current control signal CCS may include multiple bits and may have at least three values. In addition, in the second section T2, the bits of the frequency control signal FCS controlling the frequency of the pumping clock PCLK and the bits of the current control signal CCS controlling the amount of the program current Ip may vary.

Figure 7:
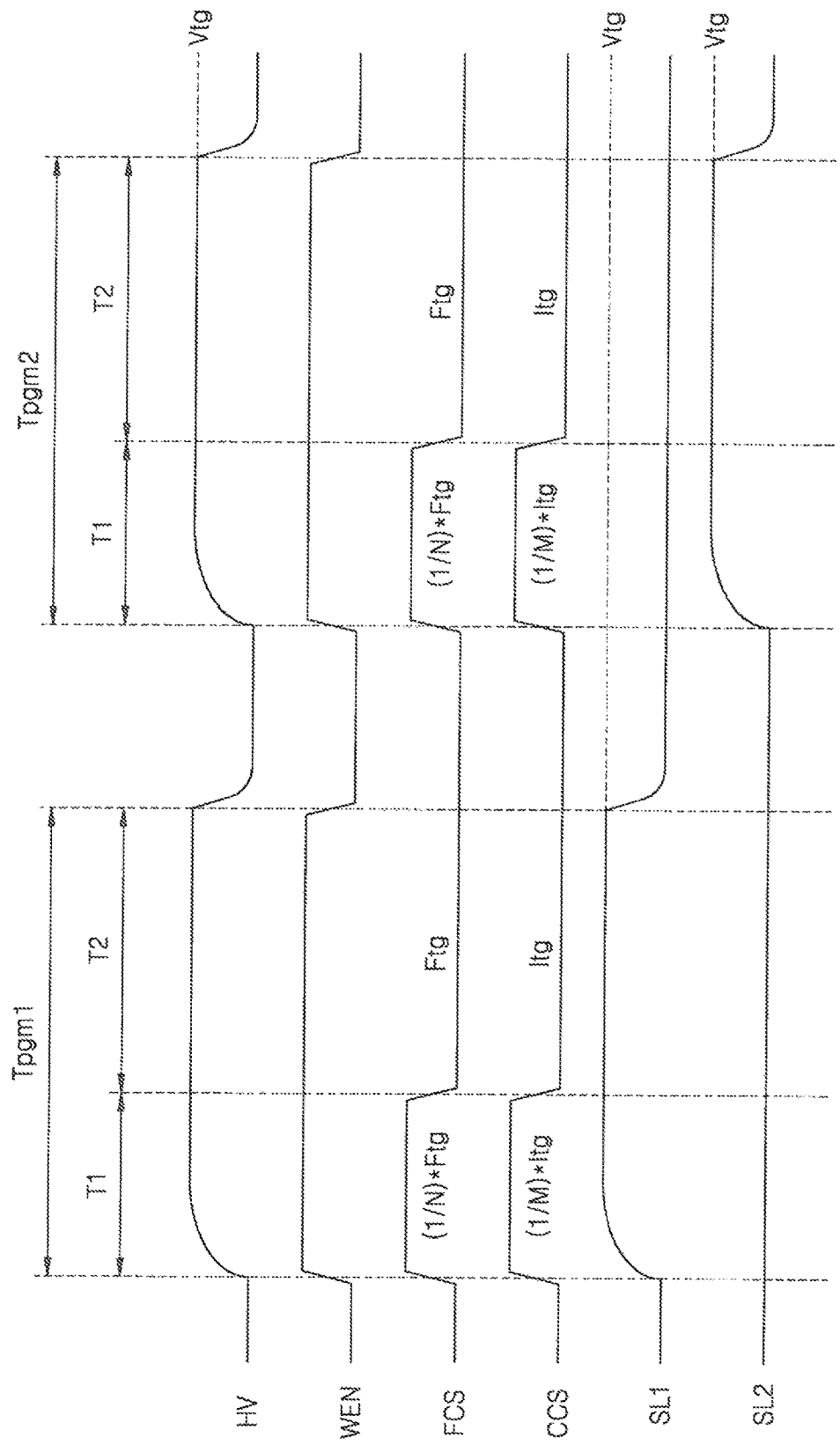
FIG. 7 shows examples of control signals, waveforms of high voltages and waveforms of source lines of a memory device according to an embodiment of the inventive concepts.

FIG. 7 shows examples of control signals, waveforms of high voltages and waveforms of source lines of a memory device according to an embodiment of the inventive concepts. FIG. 7 shows waveforms of the control signals in program sections Tpgm1 and Tpgm2.

Referring to FIG. 7, a program operation may be performed on memory cells connected to the first source line SL1 in a first program section Tpgm1, and a program operation may be performed on memory cells connected to the second source line SL2 in a second program section Tpgm2. The high voltage HV may be generated in sections, for example, the first program section Tpgm1 and the second program section Tpgm2, in which the program operations are performed. In other words, in a section in which the write enable signal WEN is activated, the high voltage HV may be set to be at the target level Vtg and maintained.

In the first program section Tpgm1, the high voltage HV may be applied to the first source line SL1, and in the second program section Tpgm2, the high voltage HV may be applied to the second source line SL2. In the first program section Tpgm1 and the second program section Tpgm2 illustrated in FIG. 7, the high voltages HV are applied to different source lines, and a parasitic capacitor of each of the first source line SL1 and the second source line SL2 may function as a load capacitor of the HV generator 131. Thus, in initial parts of the first program section Tpgm1 and in initial parts of the second program section Tpgm2, the high voltage HV may be boosted to be at the target level Vtg, and thus a peak current may flow.

The memory device 100 (of FIG. 1) according to an embodiment may decrease the peak current and may stably generate the high voltage HV by controlling the frequency of the pumping clock PCLK and the amount of the program current Ip by using the control signals in each program section, for example, the first program section Tpgm1 and the second program section Tpgm2, as described above with reference to FIGS. 6A to 6C.

Figure 8A:
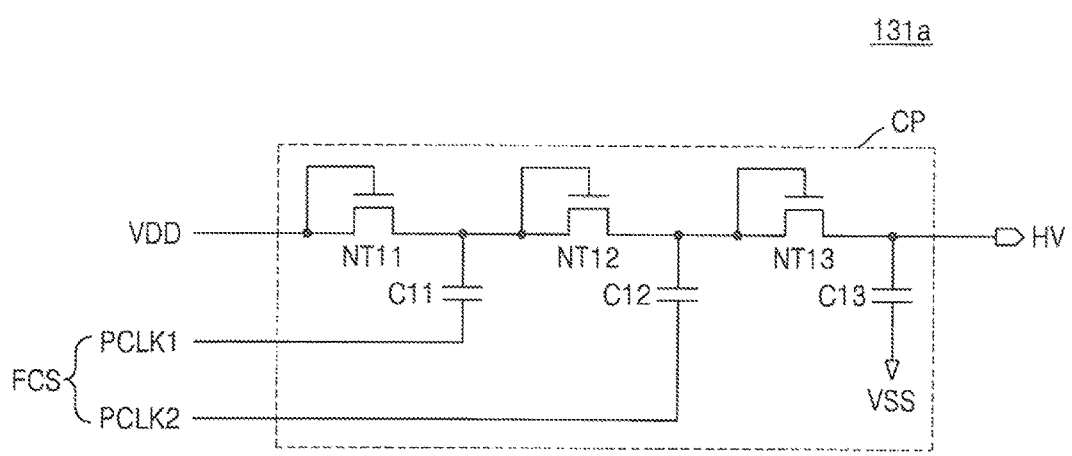
FIGS. 8A and 8B are circuit diagrams showing examples of high voltage generators according to an embodiment of the inventive concepts.
Figure 8B:
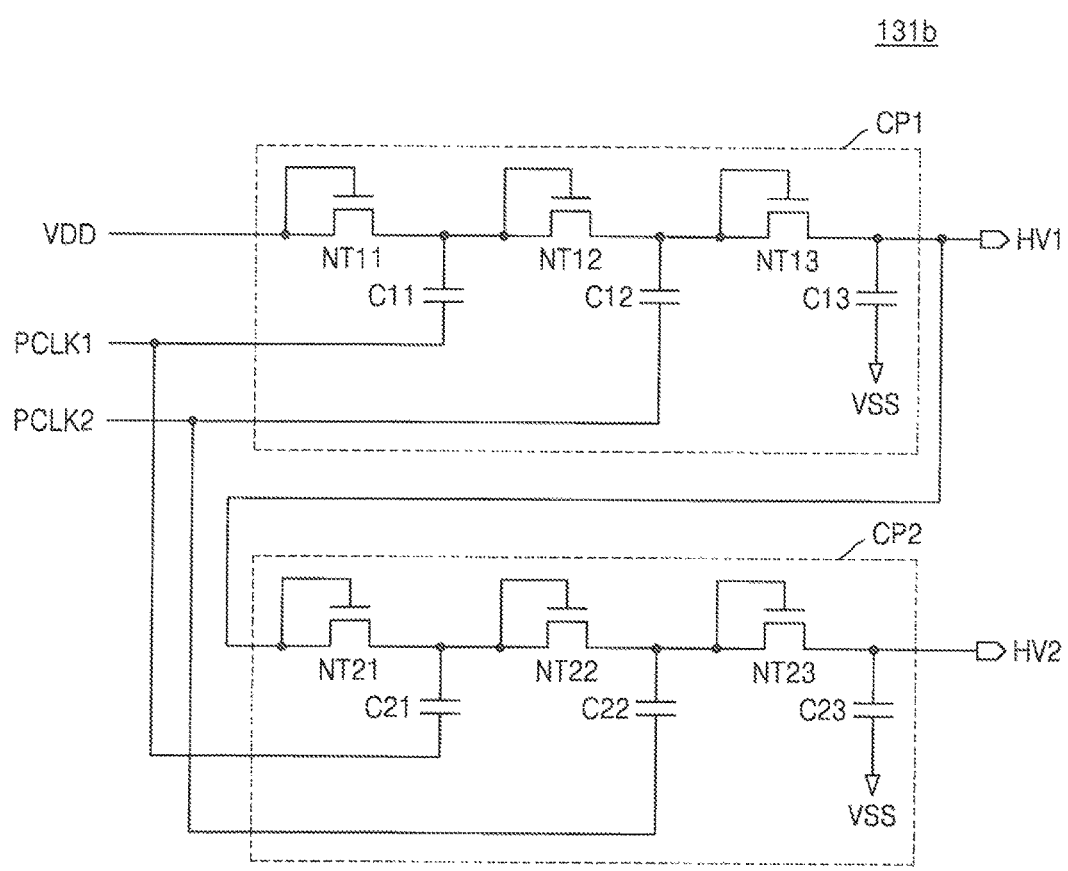
Figure 8C:
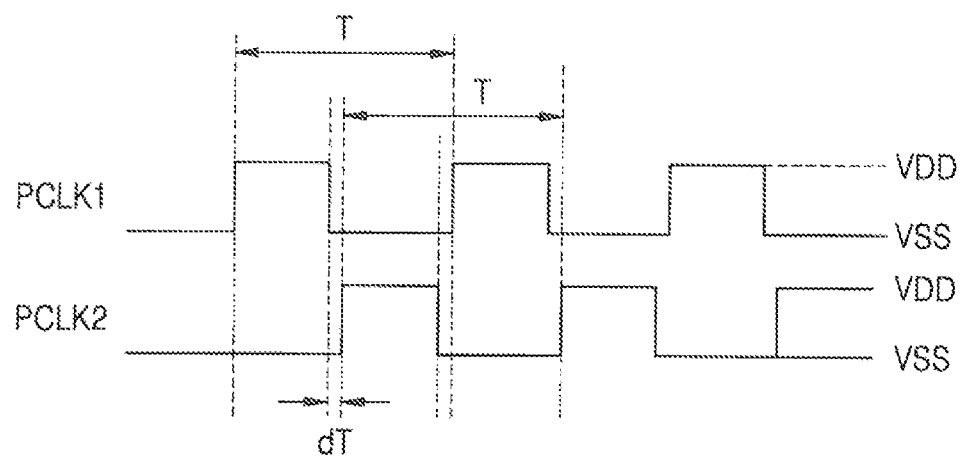
FIG. 8C is a waveform diagram of pumping clocks.

FIGS. 8A and 8B are circuit diagrams showing examples of HV generators 131a and 131b, respectively, according to an embodiment of the inventive concepts. FIG. 8C is a waveform diagram of pumping clocks.

Referring to FIG. 8A, the HV generator 131a may be embodied as a charge pump CP that may include first to third transistors NT11 to NT13 and first and second pumping capacitors C11 and C12. The charge pump CP may further include a stabilization capacitor C13. The number of first to third transistors NT11 to NT13 and the number of first and second pumping capacitors C11 and C12 may differ according to a target level of the high voltage HV, that is, the number of times a power voltage VDD is to be boosted.

A first pumping clock PCLK1 may be applied to a terminal of the first pumping capacitor C11, a second pumping clock PCLK2 may be applied to a terminal of the second pumping capacitor C12, and the power voltage VDD may be applied to a source (or a drain) of the first transistor NT11. The frequency of the first pumping clock PCLK1 and the second pumping clock PCLK2 may be determined based on the frequency control signal FCS.

Referring to FIG. 8C, the first pumping clock PCLK1 and the second pumping clock PCLK2 may transition between the power voltage VDD and a ground voltage VSS in every cycle T, and phases of the first pumping clock PCLK1 may be different than phases of the second pumping clock PCLK2. In an embodiment, the phase of the first pumping clock PCLK1 may be opposite the phase of the second pumping clock PCLK2. In an embodiment, after one pumping clock transitions from the power voltage VDD to the ground voltage VSS, another pumping clock may transition from the ground voltage VSS to the power voltage VDD. For example, after the first pumping clock PCLK1 transitions from the power voltage VDD to the ground voltage VSS, the second pumping clock PCLK2 may transition from the ground voltage VSS to the power voltage VDD after a certain time dT.

Referring back to FIG. 8A, according to an operation of turning on/off the first to third transistors NT11 to NT13 and changes in levels of the first and second pumping clocks PCLK1 and PCLK2, the power voltage VDD is boosted to generate the high voltage HV.

Referring to FIG. 8B, the HV generator 131b may generate first and second high voltages HV1 and HV2. The HV generator 131b may include a first charge pump CP1 generating the first high voltage HV1 and a second charge pump CP2 generating the second high voltage HV2 based on the first high voltage HV1. A level of the second high voltage HV2 may be higher than that of the first high voltage HV1. Structures and operations of the first charge pump CP1 and the second charge pump CP2 are similar to those of the charge pump CP of FIG. 8A, and thus detailed descriptions thereof will be omitted.

FIG. 8B shows that the second high voltage HV2 may be generated based on the first high voltage HV1. However, the inventive concepts are not limited thereto. The second charge pump CP2 may receive the power voltage VDD to generate the second high voltage HV2.

Figure 9:
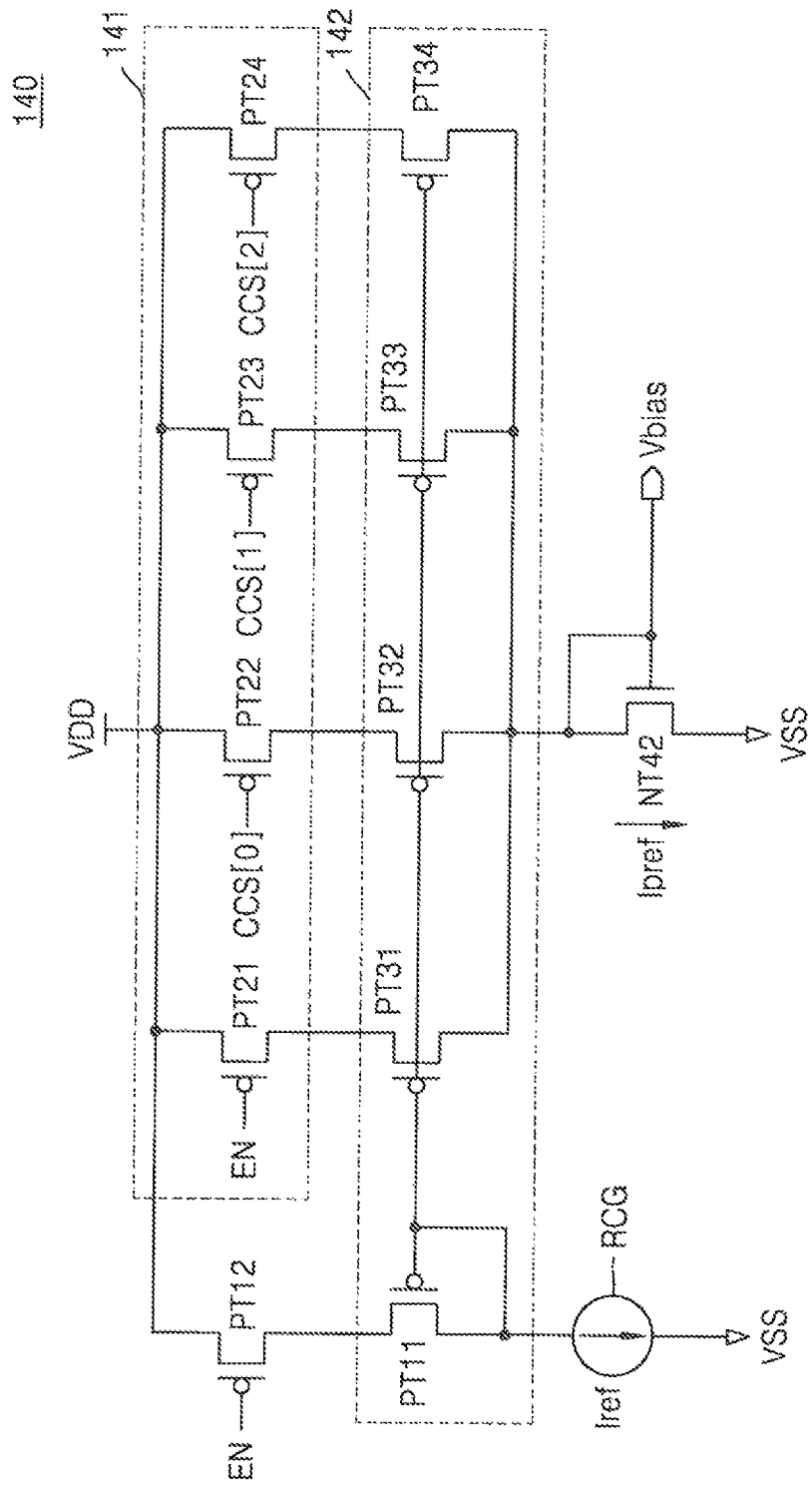
FIG. 9 is a circuit diagram showing an example of a program current controller according to an embodiment of the inventive concepts.

FIG. 9 is a circuit diagram showing an example of the program current controller 140 according to an embodiment of the inventive concepts.

Referring to FIG. 9, the program current controller 140 may include a reference current source RCG, a current mirroring circuit 142, a current control circuit 141, and a transistor NT42 generating a bias voltage Vbias. In addition, the program current controller 140 may further include a transistor PT12 determining whether to perform an operation.

An enable signal EN may be transmitted to the transistor PT12. The enable signal EN may be based on a write enable signal, such as write enable signal WEN illustrated in FIGS. 6A-6C. When the enable signal EN is activated (e.g., logic low), the program current controller 140 may operate. The reference current source RCG may generate a reference current Iref. The current mirroring circuit 142 may perform mirroring for the reference current Iref. Accordingly, a current that is substantially the same as the reference current Iref may flow in transistors PT31, PT32, PT33, and PT34.

The enable signal EN and current control signals CCS[0] to CCS[2] may be respectively transmitted to transistors PT21, PT22, PT23, and PT24 of the current control circuit 141. According to the enable signal EN and the current control signals CCS[0] to CCS[2], the transistors PT21, PT22, PT23, and PT24 may be turned on or off. At least some of the transistors PT21, PT22, PT23, and PT24 may be turned on, and a current that is proportional to the reference current Iref may flow in transistors corresponding to the at least some of the transistors PT21, PT22, PT23, and PT24 which are on. Thus, according to the current control signals CCS[0] to CCS[2], a program reference current Ipref may change.

Based on the program reference current Ipref flowing in the transistor NT42, a bias voltage Vbias may be generated. When the amount of the program reference current Ipref increases, a level of the bias voltage Vbias may increase. When the amount of the program reference current Ipref decreases, the level of the bias voltage Vbias may decrease. Therefore, according to the current control signals CCS[0] to CCS[2], the level of the bias voltage Vbias may be determined.

As described above with reference to FIG. 9, the program current controller 140 may adjust the level of the bias voltage Vbias by controlling the program reference current Ipref digitally based on the current control signals CCS[0] to CCS[2].

Figure 10:
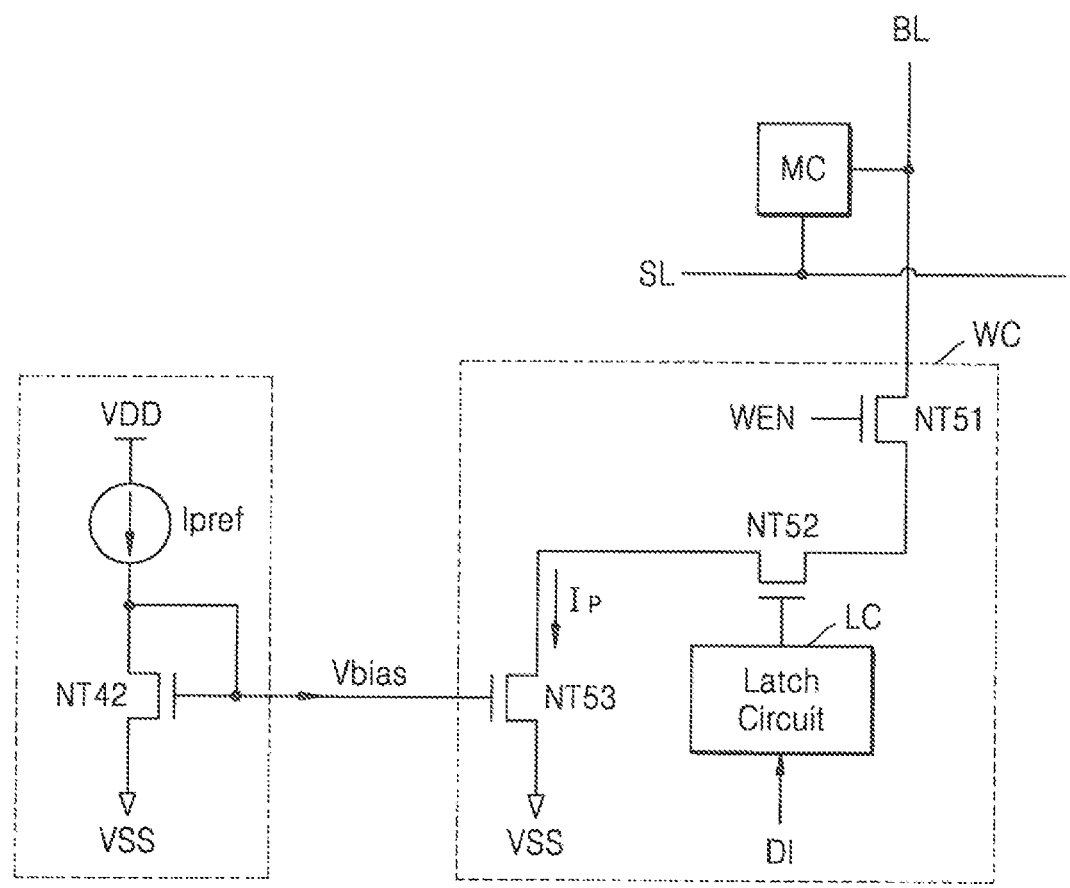
FIG. 10 is a circuit diagram showing an example of a write circuit according to an embodiment of the inventive concepts.

FIG. 10 is a circuit diagram showing an example of a write circuit WC according to an embodiment of the inventive concepts. Referring to FIG. 10, the write circuit WC may include transistors NT51 to NT53 and a latch circuit LC. The transistors NT51 to NT53 may be connected to a bit line BL through the column decoder 160 (see FIG. 1). FIG. 10 also illustrates portions of the program current controller 140, including the transistor NT42, as illustrated in FIG. 9. A duplicate description of these portions is omitted.

When the write enable signal WEN is activated, the transistor NT51 may be turned on, and when the transistor NT52 is turned on in response to an output from the latch circuit LC, the transistor NT53 may provide the program current Ip to the bit line BL. The program current Ip may flow from a source line SL to the bit line BL through the memory cell MC. Accordingly, the memory cell MC may be programmed. The amount of the program current Ip may be adjusted according to the level of the bias voltage Vbias. Since, as discussed with respect to FIG. 9, the bias voltage Vbias may be controlled responsive to the current control signal CCS, the amount of the program current Ip may also be controlled responsive to the current control signal CCS. As described above with reference to FIG. 4, the program current Ip may be output from the HV generator 131 providing the high voltage HV to the source line SL.

The latch circuit LC may output a gate voltage to selectively turn on the transistor NT52 according to a logic level of input data DI. For example, when the logic level of the input data DI is '1', the transistor NT52 may be turned on to program the memory cell MC, and when the logic level of the input data DI is '0', the transistor NT52 may be turned on not to program the memory cell MC.

Figure 11:
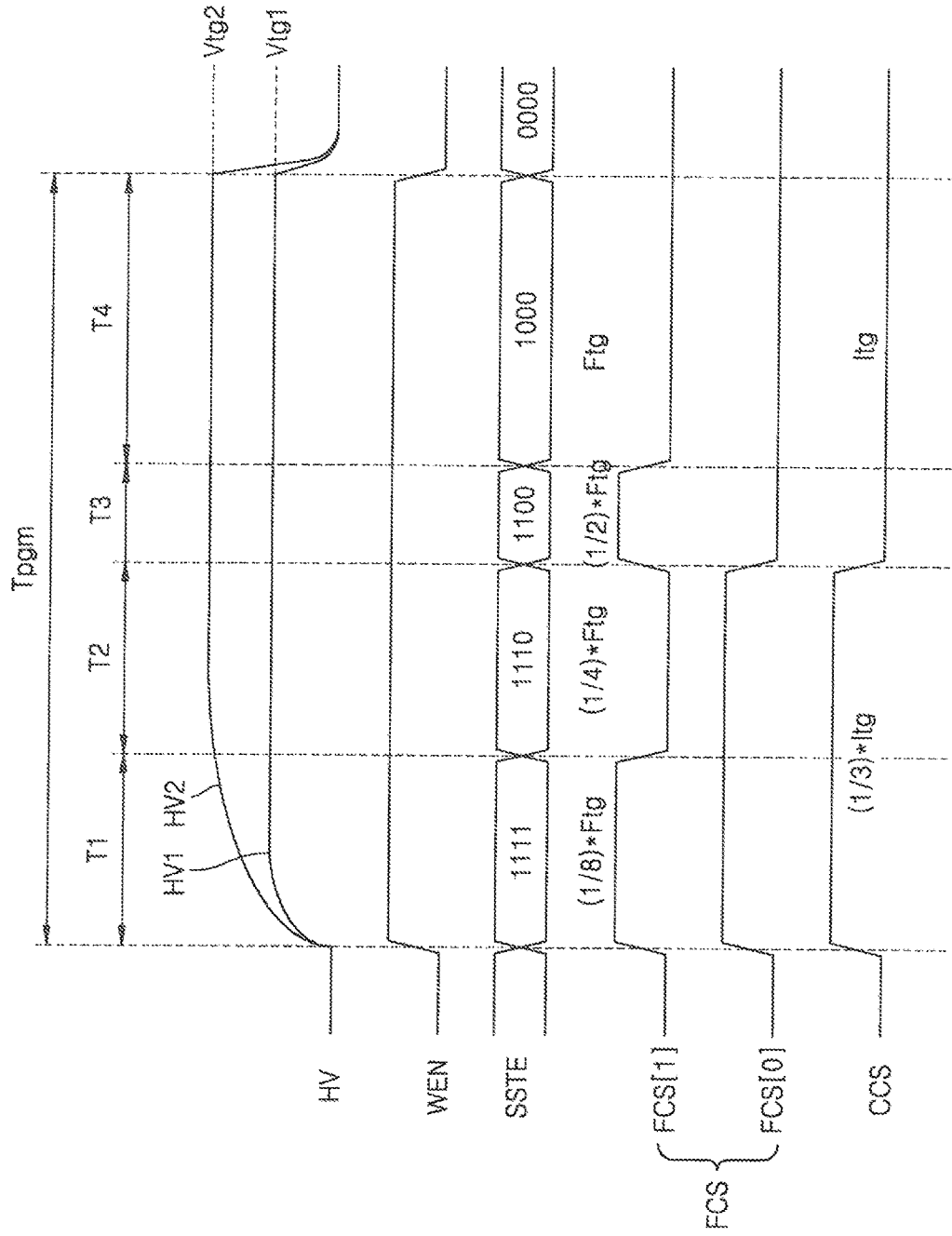
FIG. 11 shows an example of control signals and waveforms of high voltages of a memory device according to an embodiment of the inventive concepts.

FIG. 11 shows an example of control signals and waveforms of high voltages of a memory device according to an embodiment of the inventive concepts. As described above with reference to FIG. 8, FIG. 11 shows the control signals and the waveforms of the high voltages of the memory device when the HV generator 131 generates high voltages, for example, a first high voltage HV1 and a second high voltage HV2.

Referring to FIG. 11, a level of the second high voltage HV2 may be higher than that of the first high voltage HV1. During the program operation, the first high voltage HV1 may be applied to a source line (SL of FIG. 3A), and the second high voltage HV2 may be applied to a control line CL (of FIG. 3A).

The program section Tpgm may include first to fourth sections T1 to T4. The first to fourth sections T1 to T4 may be distinguished according to state signals SSTE. In the first section T1, the first high voltage HV1 may be set to be at a first target level Vtg1, and in the first section T1 and the second section T2, the second high voltage HV2 may be set to be at a second target level Vtg2. The control logic 120 may output frequency control signals FCS [0] and FCS[1] that increase the frequency of the pumping clock PCLK stepwise, in the first to fourth sections T1 to T4. Accordingly, the frequency of the pumping clock PCLK may increase stepwise in the first to fourth sections T1 to T4. Moreover, the control logic 120 may output the current control signal CCS increasing the amount of the program current Ip stepwise, in the first to fourth sections T1 to T4 to the program current controller 140.

The control logic 120 may control, in the first section T1, the frequency of the pumping clock PCLK to be lower than the target frequency Ftg and control the amount of the program current Ip to be less than the target current amount Itg, and then may increase the frequency of the pumping clock PCLK and the amount of the program current Ip. For example, the frequency of the pumping clock PCLK may be controlled to be ⅛ times as high as the target frequency Ftg in the first section T1, to be ¼ times as high as the target frequency Ftg in the second section T2, to be ½ times as high as the target frequency Ftg in the third section T3, and to be equivalent to the target frequency Ftg in the fourth section T4. Also, the amount of the program current may be controlled to be ⅓ times as great as the target current amount Itg in the first section T1 and the second section T2 and to be equivalent to the target current amount Itg in the third section T3 and fourth section T4. For convenience, although specific values have been used, the inventive concepts are not limited thereto. The values may change according to characteristics of the memory cell array 110 and/or circuit characteristics of the HV generator 131.

As described with reference to FIG. 11, as the frequency of the pumping clock PCLK and the amount of the program current Ip increase stepwise, the peak current flowing in the memory device 100 may be reduced.

Figure 12:
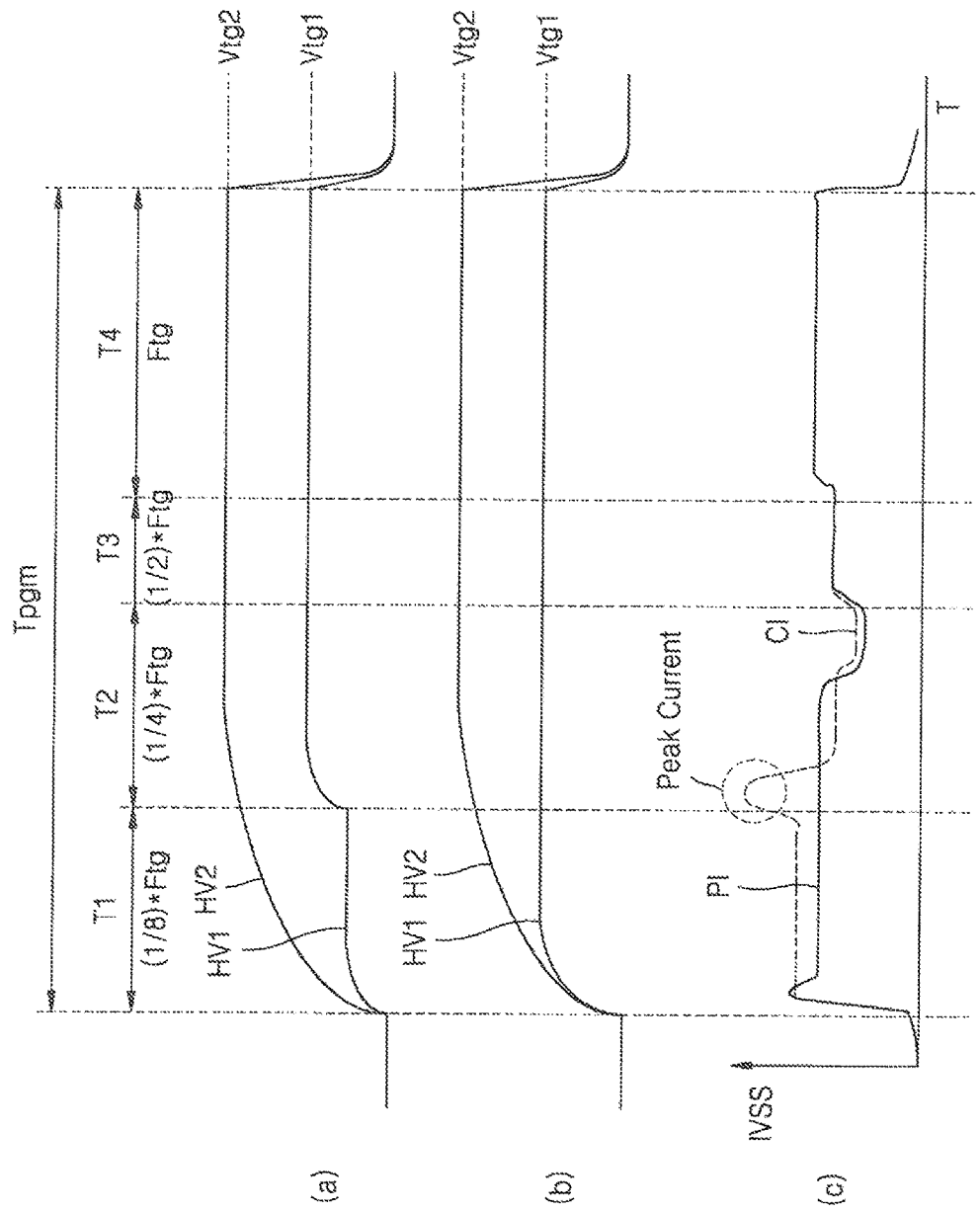
FIG. 12 is a waveform diagram showing waveforms of high voltages and consumed current of a memory device.

FIG. 12 is a waveform diagram showing waveforms of high voltages and a consumed current of a memory device. Graph (a) shows waveforms of high voltages of a memory device that only controls a frequency of a pumping clock that is a comparative example of the memory device 100 (of FIG. 1) according to an embodiment of the inventive concepts. Graph (b) shows waveforms of high voltages of the memory device 100 according to an embodiment of the inventive concepts, and graph (c) shows a waveform of a consumed current PI (a solid line) of the memory device 100 according to an embodiment of the inventive concepts and a waveform of a consumed current CI (a dotted line) of the memory device according to the comparative example.

Referring to graph (a), in the memory device according to the comparative example, when the frequency of the pumping clock PCLK is set to be a low frequency, for example, ⅛ times of the target frequency Ftg, a first high voltage HV1 may not be properly boosted in the first section T1 and may be boosted to reach a first target level Vtg1 after the frequency of the pumping clock PCLK increases in the second section T2. In this case, referring to graph (c), the frequency of the pumping clock PCLK may increase in the second section T2 and the first high voltage HV1 is boosted so that a peak current may increase.

Referring to graph (b), in the memory device 100 according to an embodiment of the inventive concepts, as the frequency of the pumping clock PCLK is set to be a low frequency, for example, ⅛ times of the target frequency Ftg, and the amount of the program current Ip is less than the target current amount Itg in the first section T1, the first high voltage HV1 may be boosted to reach the first target level Vtg1 normally. Therefore, the consumed current PI of the memory device 100 according to an embodiment of the inventive concepts may be relatively uniform in the program section Tpgm, and an excessive peak current may be reduced. The consumed current PI of the memory device 100 according to an embodiment of the inventive concepts may be limited not to exceed a preset maximum value.

Figure 13:
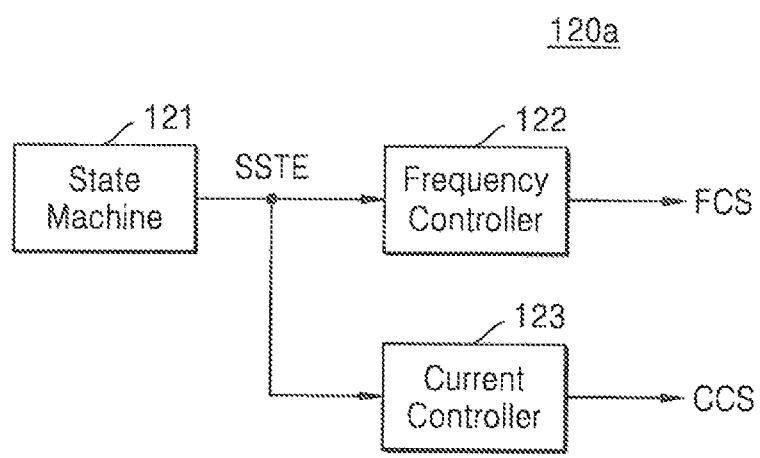
FIG. 13 is a block diagram of an example of a control logic according to an embodiment of the inventive concepts.

FIG. 13 is a block diagram of an example of a control logic 120a according to an embodiment of the inventive concepts.

Referring to FIG. 13, the control logic 120a may include a state machine 121, a frequency controller 122, and a current controller 123. In an embodiment, the frequency controller 122 and the current controller 123 may be embodied as one module.

The state machine 121 may generate a state signal SSTE. As shown in FIG. 11, the state signal SSTE may have a value that changes according to time in order to indicate each section (i.e., each of the first to fourth sections T1 to T4) of the program section Tpgm. In an embodiment, the state machine 121 may generate a state signal SSTE based on a preset logic time. In another embodiment, the state machine 121 may generate a state signal SSTE according to a level of a high voltage HV. The frequency controller 122 may generate a frequency control signal FCS according to the state signal SSTE, and the current controller 123 may generate a current control signal CCS according to the state signal SSTE.

Figure 14:
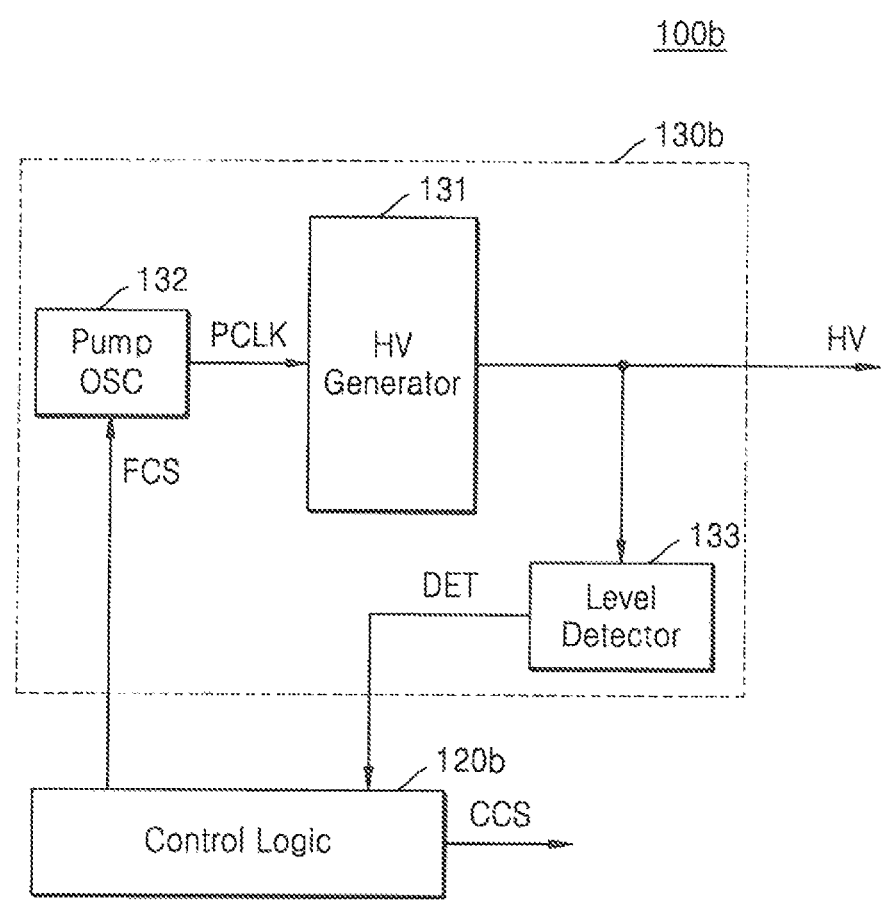
FIG. 14 is a block diagram schematically showing a memory device according to another embodiment of the inventive concepts.

FIG. 14 is a block diagram schematically showing a memory device 100b according to another embodiment of the inventive concepts.

Referring to FIG. 14, the memory device 100b may include a voltage generation circuit 130b and a control logic 120b. The memory device 100b may further include other components of the memory device 100 of FIG. 1, and the components of the memory device 100b may operate in a similar manner as the components of the memory device 100. Thus, a difference between the memory device 100b and the memory device 100 will be mainly described.

The voltage generation circuit 130b may include the HV generator 131, the pumping clock generator 132, and a level detector 133. The level detector 133 may detect a level of a high voltage HV and provide a detection signal DET to the control logic 120b. In an embodiment, the detection signal DET may indicate a level of the high voltage HV. In another embodiment, the detection signal DET may indicate whether the high voltage HV has reached at least one predetermined level. As described with reference to FIG. 8B, when the HV generator 131 generates high voltages, for example, a first high voltage HV1 and a second high voltage HV2, the level detector 133 may generate detection signals DET by respectively detecting the first high voltage HV1 and/or the second high voltage HV2.

The control logic 120b may generate the frequency control signal FCS and the current control signal CCS based on the detection signals DET. The control logic 120b may change values of the frequency control signal FCS and/or the current control signal CCS according to a level of the high voltage HV determined based on the detection signals DET. In an embodiment, the state machine 121 that has been described with reference to FIG. 13 may generate the state signals SSTE based on the detection signals DET.

Figure 15:
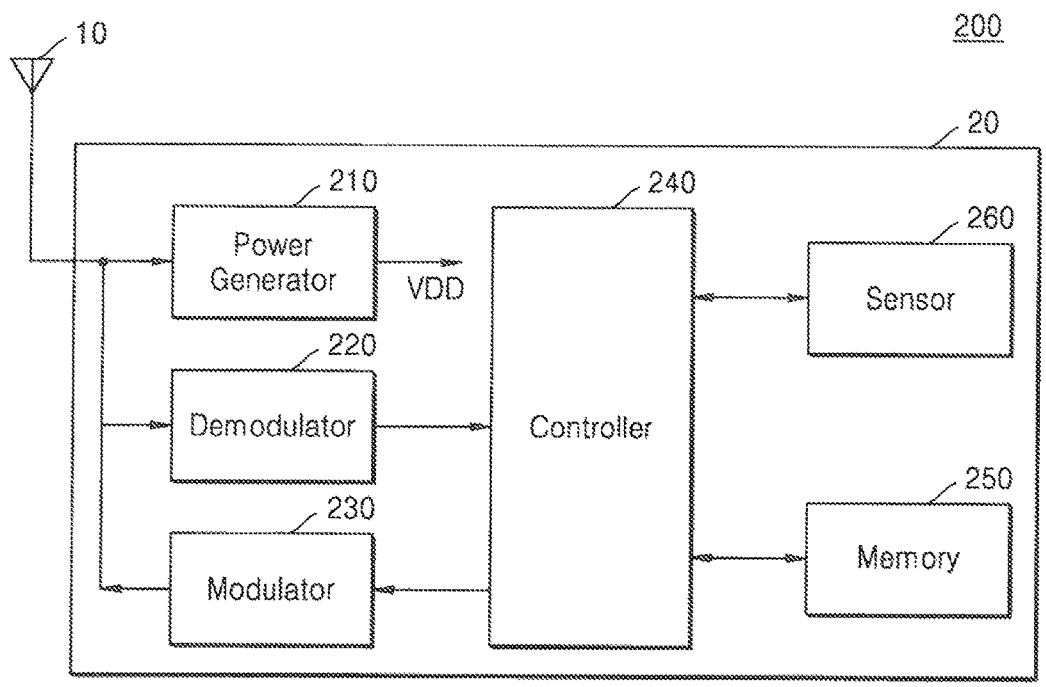
FIG. 15 is a block diagram schematically showing a radio frequency identification (RFID) card according to an embodiment of the inventive concepts.

FIG. 15 is a block diagram schematically showing an RFID card 200 according to an embodiment of the inventive concepts.

The RFID card 200 stores identification information and/or data read from a sensor and may provide the data to a reader in a short distance through short-range wireless communication (RF communication) when the reader requests the data. The RFID card 200 may be referred to as an RFID tag or a transponder.

The RFID card 200 may be an active RFID card that includes a battery and generates driving power by itself or a passive RFID card that converts signals, which are received from the reader, into direct current (DC) voltage signals and uses the DC voltage signals as driving power. In the present embodiment, the RFID card 200 may be of a passive type.

Referring to FIG. 15, the RFID card 200 may include an antenna 10 and an integrated circuit (IC) 20, and the IC 20 may include a power generator 210, a demodulator 220, a modulator 230, a controller 240, and a memory 250. The IC 20 may further include a sensor 260. In an embodiment, the RFID card 200 may further include a security circuit, etc.

The antenna 10 may receive signals in a certain frequency from the reader and/or may directly transmit signals to the reader. The antenna 10 may have a certain pattern and may be electrically connected to the IC 20.

The components of the IC 20, for example, the power generator 210, the demodulator 220, the modulator 230, the controller 240, and the memory 250, may be integrated into one semiconductor chip. In an embodiment, the sensor 260 may also be integrated into one semiconductor chip along with the aforementioned components. In an embodiment, the antenna 10 may be on the same semiconductor chip as the IC 20.

The power generator 210 may receive wireless power from the reader. The power generator 210 may generate an alternating current (AC) according to methods such as inductive coupling or electromagnetic capturing and may convert the AC into a DC voltage. In an embodiment, the power generator 210 may generate a DC voltage by rectifying an AC that is generated by RF signals received from the reader. To this end, the power generator 210 may include a rectifier and/or a regulator. The power generator 210 may provide other components of the IC 20, for example, the demodulator 220, the modulator 230, the controller 240, the memory 250, and/or the sensor 260, with the generated DC voltage as the power voltage VDD.

The demodulator 220 may convert signals received from the antenna 10 into digital data that is legible and may provide the digital data to the controller 240.

The modulator 230 may convert data, which is to be transmitted to the reader, into designated high-frequency signals and thus may provide the high-frequency signals through the antenna 10.

The controller 240 may control all operations of the IC 20. The controller 240 may store received data in the memory 250 and/or may read data from the memory 250. The controller 240 may also store, in the memory 250, data provided by the sensor 260. The controller 240 may be embodied as a micro controller, a central processing unit (CPU), or the like.

The memory 250 may store identification data, data received from the reader, and/or data provided by the sensor 260. The memory 250 may be embedded flash memory, and the memory devices 100 and 100b described with reference to FIGS. 1 to 14 may include the memory 250. Therefore, the memory 250 may generate a high voltage based on the power voltage VDD and may perform the program operation based on the generated high voltage. The memory 250 may prevent or reduce a large amount of peak current from being generated while the high voltage is generated. The generated high voltage of the memory 250 may be similar to the high voltage HV discussed and illustrated with respect to FIGS. 1 to 14.

The RFID card 200 may generate a current based on external signals and thus may not easily generate a large amount of current. Thus, the amount of current provided to the memory 250 may be small. As described above, however, the memory 250 may prevent or reduce a large amount of peak current from being generated and may generate a high voltage with a small amount of current normally. Therefore, the memory 250 may stably perform a program operation, and the reliability of data stored in the memory 250 may be improved.

The sensor 260 may detect an external environment and may generate sensing signals according to a detection result. For example, the sensor 260 may be a touch sensor, a temperature sensor, an illumination sensor, a bio sensor, or the like. However, the sensor 260 is not limited thereto.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been particularly shown and described with reference to embodiments thereof, it will be understood that various changes in form and details may be made therein without departing from the spirit and scope of the following claims.

What is claimed is:

1. A non-volatile memory device comprising:
   a memory cell array comprising a plurality of memory cells, wherein at least one selected memory cell that is selected from among the plurality of memory cells is programmed based on a high voltage;
   a high voltage generator configured to generate the high voltage by boosting an input voltage based on a pumping clock;
   a pumping clock generator configured to generate the pumping clock;
   a program current controller configured to adjust a program current flowing in the at least one selected memory cell in a program section comprising a first section and a second section; and
   a control logic configured to control a frequency of the pumping clock and an amount of the program current based on a time in the program section in which the at least one selected memory cell is programmed,
   wherein the control logic is configured to control the frequency of the pumping clock in the first section to be a first frequency that is lower than a second frequency of the pumping clock in the second section, and
   wherein the control logic is configured to control a first amount of the program current in the first section to be less than a second amount of the program current in the second section.

2. The non-volatile memory device of claim 1, wherein the control logic is configured to control the pumping clock generator to increase the frequency of the pumping clock stepwise according to the time in the program section and to control the program current controller to increase the amount of the program current stepwise according to the time in the program section.

3. The non-volatile memory device of claim 1, wherein the control logic is configured to provide the pumping clock generator with a frequency control signal and the program current controller with a current control signal,
   wherein the frequency control signal is used to control the first frequency of the pumping clock in the first section to be lower than the second frequency of the pumping clock in the second section, and
   wherein the current control signal is used to control the first amount of the program current in the first section to be less than the second amount of the program current in the second section.

4. The non-volatile memory device of claim 3, wherein the control logic comprises a state machine configured to generate state signals based on a preset time and is configured to change a value of the frequency control signal and a value of the current control signal according to states indicated by the state signals.

5. The non-volatile memory device of claim 1, wherein the high voltage generator comprises:
   a first charge pump configured to generate a first high voltage; and
   a second charge pump configured to generate a second high voltage having a higher level than the first high voltage, and
   wherein the control logic is configured to control the frequency of the pumping clock to be 1/N times as high as a target frequency, and the amount of the program current to be 1/M times as great as a target current amount, before the first high voltage and the second high voltage respectively reach a first target level and a second target level, and to control the frequency of the pumping clock and the amount of the program current to be equivalent to the target frequency and the target current amount, respectively, after the first high voltage and the second high voltage reach the first target level and the second target level, respectively,
   wherein N is an integer greater than 1, and
   wherein M is an integer greater than 1.

6. The non-volatile memory device of claim 5, wherein the control logic is configured to control the frequency of the pumping clock to be lower than or equal to ¼ of the target frequency and to control the amount of the program current to be less than or equal to ⅓ of the target current amount, before the first high voltage and the second high voltage respectively reach the first target level and the second target level.

7. The non-volatile memory device of claim 5, wherein the first high voltage is applied to a source line connected to the at least one selected memory cell, and
   the second high voltage is applied to a control line connected to the at least one selected memory cell.

8. The non-volatile memory device of claim 1, further comprising a voltage detector configured to detect a level of the high voltage and output a detection signal,
   wherein the control logic is configured to receive the detection signal and control the frequency of the pumping clock and the amount of the program current based on the detection signal during the program section.

9. The non-volatile memory device of claim 1, wherein, in the program section, an amount of a consumed current of the non-volatile memory device is limited not to exceed a preset maximum amount.

10. The non-volatile memory device of claim 1, wherein the at least one selected memory cell is programmed in a hot carrier injection (HCI) manner based on the program current.

11. The non-volatile memory device of claim 1, wherein the non-volatile memory device is on a substrate of an electronic device, the substrate being the same as a substrate on which other components of the electronic device are disposed.

12. A non-volatile memory device comprising:
a memory cell array comprising memory cells that are programmed based on a high voltage and a program current;
a high voltage generator configured to generate the high voltage by boosting an input voltage based on a pumping clock; and
a control logic configured to control a frequency of the pumping clock and an amount of the program current of the high voltage generator to change stepwise during the generation of the high voltage,
wherein the control logic is configured to control the amount of the program current to be less than a target current amount in a first section of a program section, and to control the amount of the program current to be equivalent to the target current amount after the first section of the program section, and
wherein the first section is a portion of the program section in which the high voltage has not reached a target high voltage level.

13. The non-volatile memory device of claim 12, wherein the control logic is configured to control the frequency of the pumping clock to be lower than a target frequency in the first section of the program section, and to control the frequency of the pumping clock to be equivalent to the target frequency after the first section of the program section.

14. The non-volatile memory device of claim 13, wherein the control logic is configured to control the frequency of the pumping clock to be lower than the target frequency and the amount of the program current to be equivalent to the target current amount in a second section of the program section that is after the first section and in which the high voltage reaches the target high voltage level, and to control the frequency of the pumping clock and the amount of the program current to be respectively equivalent to the target frequency and the target current amount in a third section of the program section that is after the second section.

15. The non-volatile memory device of claim 12, further comprising:
a pumping clock generator configured to generate the pumping clock and adjust the frequency of the pumping clock in response to a frequency control signal provided by the control logic;
a write circuit configured to provide the program current to a memory cell selected from among the memory cells; and
a program current controller that is configured to apply a bias voltage that controls the amount of the program current to the write circuit and that is configured to adjust a level of the bias voltage in response to a current control signal provided by the control logic.

16. The non-volatile memory device of claim 12, wherein the control logic is configured to control the frequency of the pumping clock and the amount of the program current based on a time in the program section in which at least one selected memory cell of the memory cell array is programmed.

17. A non-volatile memory device comprising:
a high voltage generation circuit configured to generate a high voltage from an input voltage based on a pumping clock signal;
a program current controller configured to control a program current;
a memory cell array comprising at least one memory cell that is configured to be programmed responsive to the high voltage and the program current; and
a control logic configured to control a frequency of the pumping clock signal and an amount of the program current based on a time period within a program operation during which the high voltage is generated,
wherein the control logic is configured to control the frequency of the pumping clock signal to be a first frequency that is less than a target frequency in a first time period of the program operation and to be equivalent to the target frequency in a second time period of the program operation, after the first time period, and
wherein the control logic is configured to control the amount of the program current to be a first current amount that is less than a target current amount in the first time period of the program operation and to be equivalent to the target current amount in the second time period.

18. The non-volatile memory device of claim 17, wherein the control logic controls the frequency of the pumping clock signal with a frequency control signal transmitted to the high voltage generation circuit, and
wherein the control logic controls the amount of the program current with a current control signal transmitted to the program current controller.

19. The non-volatile memory device of claim 18, wherein the frequency control signal and/or the current control signal comprise multiple bits, and
wherein the control logic is configured to control the frequency of the pumping clock signal to be a second frequency that is greater than the first frequency and less than the target frequency and/or to control the amount of the program current to be a second current amount that is greater than the first current amount and less than the target current amount, during a third time period of the program operation between the first time period and the second time period.

20. The non-volatile memory device of claim 17, further comprising a level detector configured to determine a level of the high voltage generated by the high voltage generation circuit, and
wherein the time period within the program operation is based on the determined level of the high voltage.

* * * * *